US012674834B2

(12) United States Patent　　　(10) Patent No.:　US 12,674,834 B2
Matsumoto et al.　　　　　　　　　(45) Date of Patent:　　　Jul. 7, 2026

(54) SEMICONDUCTOR DEVICE INCLUDING SWITCH CONTROL CIRCUIT THAT CONTROLS SWITCHES BASED ON TEST SETTING SIGNAL AND METHOD OF MANUFACTURING THE SAME

(71) Applicant: Renesas Electronics Corporation, Tokyo (JP)

(72) Inventors: Kouhei Matsumoto, Tokyo (JP); Haruko Iwai, Tokyo (JP); Masahiro Fukushima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 117 days.

(21) Appl. No.: 18/588,421

(22) Filed: Feb. 27, 2024

(65) Prior Publication Data

US 2024/0310427 A1　　Sep. 19, 2024

(30) Foreign Application Priority Data

Mar. 17, 2023　(JP) ................................. 2023-042947

(51) Int. Cl.
　　*G01R 31/26*　　　(2020.01)
(52) U.S. Cl.
　　CPC ..... *G01R 31/2644* (2013.01); *G01R 31/2607* (2013.01)

(58) Field of Classification Search
CPC ............ G01R 31/2607; G01R 31/2644; G01R 31/318314; G01R 31/28; G01R 31/2868; G01R 31/31724; G01R 31/31813; G01R 31/3185; H01L 22/14; H01L 22/20; G11C 29/12; H10P 74/207; H10P 74/23
See application file for complete search history.

(56) References Cited

U.S. PATENT DOCUMENTS

| 7,868,647 B2 * | 1/2011 | Yun ........................ G11C 29/06 |
| | | 326/16 |
| 8,169,230 B2 * | 5/2012 | Kawamura .......... G01R 31/086 |
| | | 324/551 |
| 8,390,310 B2 * | 3/2013 | Hamanaka ....... G01R 31/31716 |
| | | 324/763.01 |
| 10,677,844 B2 | 6/2020 | Suzuki et al. |

FOREIGN PATENT DOCUMENTS

JP　　　2018-190751 A　　11/2018

* cited by examiner

*Primary Examiner* — Vinh P Nguyen
(74) *Attorney, Agent, or Firm* — Rimon P.C.

(57) ABSTRACT

A switch circuit connects an external inspection device to a first internal circuit, a second internal circuit, or both the first internal circuit and the second internal circuit in a state where the external inspection device is connected to an external terminal. A switch control circuit selects a connection destination of the external inspection device in the switch circuit based on a test setting signal from outside.

15 Claims, 21 Drawing Sheets

*FIG. 3A*

OPERATION OF SWITCH CONTROL CIRCUIT (18)

|  | UMD or PMa-TMD | | PMb-TMD | PMab-TMD |
|---|---|---|---|---|
| TC | 000 | or 111 | 111 | 111 |
| MD1 | xxx | or 000 | 001 | 011 |
| SW1 | ON | | OFF | ON |
| SW2 | ON | | ON | ON |
| SW3 | OFF | | ON | ON |
| REMARKS | – | | – | ONLY INPUT |

*FIG. 3B*

OPERATION OF SWITCH CONTROL CIRCUIT (18)

|  | UMD or PMa-TMD | PMb-TMD | PMab-TMD |
|---|---|---|---|
| MD3 | GND | GND | VCC |
| MD4 | GND | VCC | VCC |
| SW1 | ON | OFF | ON |
| SW2 | ON | ON | ON |
| SW3 | OFF | ON | ON |
| REMARKS | – | – | ONLY INPUT |

UMD(or PMa-TMD)

PMb-TMD

FIXED PATTERN

PMb-TMD

PMab-TMD

PMab-TMD

*FIG. 10*

OPERATION OF SWITCH CONTROL CIRCUIT (28)

|  | UMD or PMa-TMD | PMb-TMD | PMc-TMD | PMabc-TMD |
|---|---|---|---|---|
| MD3 | GND | GND | VCC | VCC |
| MD4 | GND | VCC | GND | VCC |
| OCTLa | ON/OFF | OFF | OFF | OFF(or ON/OFF) |
| ICTLa | ON/OFF | OFF | OFF | ON |
| SW3 | OFF | ON | OFF | ON |
| SW5 | OFF | OFF | ON | ON |
| REMARKS | -- | -- | -- | ONLY INPUT |

FIG. 12

OPERATION OF SWITCH CONTROL CIRCUIT (38) AND SWITCHING LOGIC CIRCUIT (35)

| | UMD or PMa–TMD | PMb–TMD | PMc–TMD | PMabc–TMD |
|---|---|---|---|---|
| MD3 | GND | GND | VCC | VCC |
| MD4 | GND | VCC | GND | VCC |
| OCTLa | OCTLa' | OCTLb' | OCTLc' | OCTLa' |
| DOa | DOa' | DOb' | DOc' | DOa' |
| ICTLa | ICTLa' | ICTLb' | ICTLc' | ICTLa' or ICTLb' or ICTLc' |
| DIa' | DIa | – | – | DIa (at ICTLa'=ON) |
| OCTLb | OCTLb' | – | – | – |
| DOb | DOb' | – | – | – |
| ICTLb | ICTLb' | – | – | – |
| DIb' | DIb | DIa | – | DIa (at ICTLb'=ON) |
| OCTLc | OCTLc' | – | – | – |
| DOc | DOc' | – | – | – |
| ICTLc | ICTLc' | – | – | – |
| DIc' | DIc | – | DIa | DIa (at ICTLc'=ON) |

SMALL-NUMBER-TERMINAL TEST

ALL-TERMINAL TEST

BOARD MULTI-TERMINAL COUPLING TEST

1

SEMICONDUCTOR DEVICE INCLUDING SWITCH CONTROL CIRCUIT THAT CONTROLS SWITCHES BASED ON TEST SETTING SIGNAL AND METHOD OF MANUFACTURING THE SAME

CROSS-REFERENCE TO RELATED APPLICATIONS

The disclosure of Japanese Patent Application No. 2023-042947 filed on Mar. 17, 2023 including the specification, drawings and abstract is incorporated herein by reference in its entirety.

BACKGROUND

The present disclosure relates to a semiconductor device and a method of manufacturing the semiconductor device.

There is disclosed a technique listed below.

[Patent Document 1] Japanese Unexamined Patent Application Publication No. 2018-190751

Patent Document 1 discloses a method of testing a semiconductor device using a logic built in self test (BIST) circuit and a memory BIST circuit. The logic BIST circuit executes a scan test on a scan chain. In addition, JP 2018-190751 A discloses a configuration in which a JTAG interface circuit is provided in a semiconductor device, and the logic BIST circuit and the memory BIST circuit are controlled from a test device provided outside the semiconductor device via the JTAG interface circuit.

SUMMARY

As a test method of a semiconductor device represented by, for example, a microcontroller, a system on a chip (SoC), or the like, a method of transitioning a semiconductor device to a test mode, so as to execute a test using a logic BIST circuit, a memory BIST circuit, a scan chain, or the like is known. When such a method is used, a test can be executed with a small number of external terminals, and thus, it is possible to increase the number of semiconductor devices that can be simultaneously measured, that is, the number of simultaneous measurements, with limited resources, specifically, channels included in an external inspection device. In the specification, a test using such a small number of external terminals is referred to as a small-number-terminal test.

On the other hand, actually, there is a test item that cannot be realized by the small-number-terminal test. Therefore, in addition to the small-number-terminal test, a test in a state where all the external terminals are connected to the external inspection device is also required. In the specification, such a test using all the external terminals is referred to as an all-terminal test. However, in the all-terminal test, the number of simultaneous measurements cannot be easily increased due to restriction due to the resources of the external inspection device. As a result, test cost cannot be easily reduced.

Embodiments to be described later have been made in view of such circumstances, and other issues and novel features will be apparent from the description of the present specification and the accompanying drawings.

A semiconductor device according to an embodiment includes a terminal circuit, a core unit, a switch circuit, and a switch control circuit. The terminal circuit includes a first external terminal and a second external terminal. The core unit includes a first internal circuit provided corresponding to the first external terminal and a second internal circuit provided corresponding to the second external terminal, and performs signal processing. The switch circuit is inserted on a wiring path between the terminal circuit and the core unit. The switch control circuit controls the switch circuit. Here, the switch circuit connects an external inspection device to the first internal circuit, the second internal circuit, or both the first internal circuit and the second internal circuit in a state where the external inspection device is connected to the first external terminal. The switch control circuit selects a connection destination of the external inspection device in the switch circuit based on a test setting signal from the outside.

Test cost can be reduced by using a semiconductor device of one embodiment.

BRIEF DESCRIPTION OF THE DRAWINGS

FIG. 3A is a diagram illustrating an operation example of a switch control circuit in FIG. 2.

FIG. 3B is a diagram illustrating an operation example different from that in FIG. 3A.

FIG. 10 is a diagram illustrating an operation example of the switch control circuit in FIG. 9.

FIG. 12 is a diagram illustrating an operation example of the switch control circuit and the switching logic circuit in FIG. 11.

DETAILED DESCRIPTION

In the following embodiments, when necessary for the sake of convenience, the description will be divided into a plurality of sections embodiments, but unless otherwise specified, the sections or embodiments are not unrelated to each other, and they are in a relationship in which one is a modification of a part or whole of the other one, details, supplementary description, and the like of the other one. In addition, in the following embodiments, when referring to the number of elements or the like (including the number, numerical value, amount, range, and the like), the number is not limited to the specific number, and may be the specific number or more or the specific number or less, unless otherwise stated or unless clearly limited to the specific number in principle. Furthermore, in the following embodiments, it goes without saying that the components (including element steps and the like) are not necessarily essential unless otherwise specified or considered to be obviously essential in principle. Similarly, in the following embodiments, when referring to the shape, positional relationship, and the like of the components and the like, it is assumed to include those substantially approximate or similar to the shape and the like unless otherwise specified or unless clearly considered not to include those in principle. The same applies to the above numerical values and ranges.

Hereinafter, embodiments will be described in detail with reference to the drawings. In all the drawings for describing the embodiments, members having the same functions are denoted by the same reference signs, and repeated description thereof will be omitted. In addition, in the following embodiments, descriptions of the same or similar parts will not be repeated in principle unless particularly necessary.

First Embodiment

<Various Test Methods>

Figure 15A:
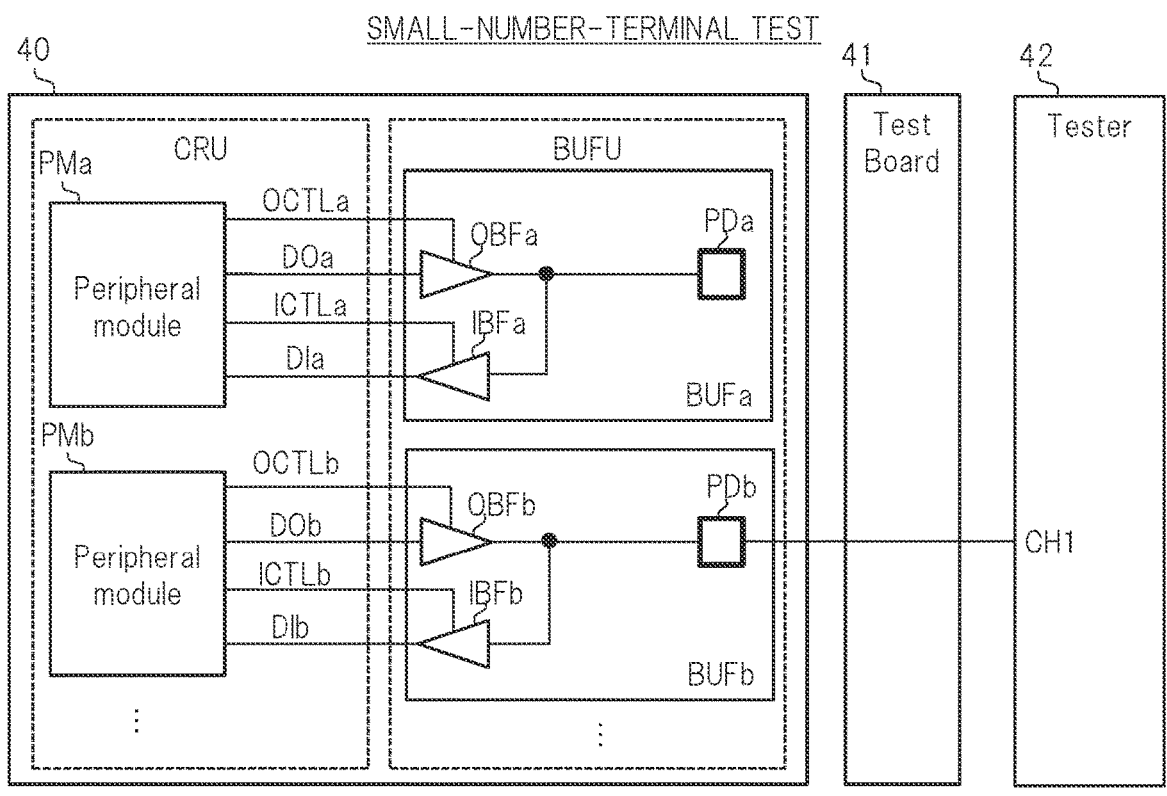
FIG. 15A is a schematic diagram illustrating an example of a small-number-terminal test.
Figure 15B:
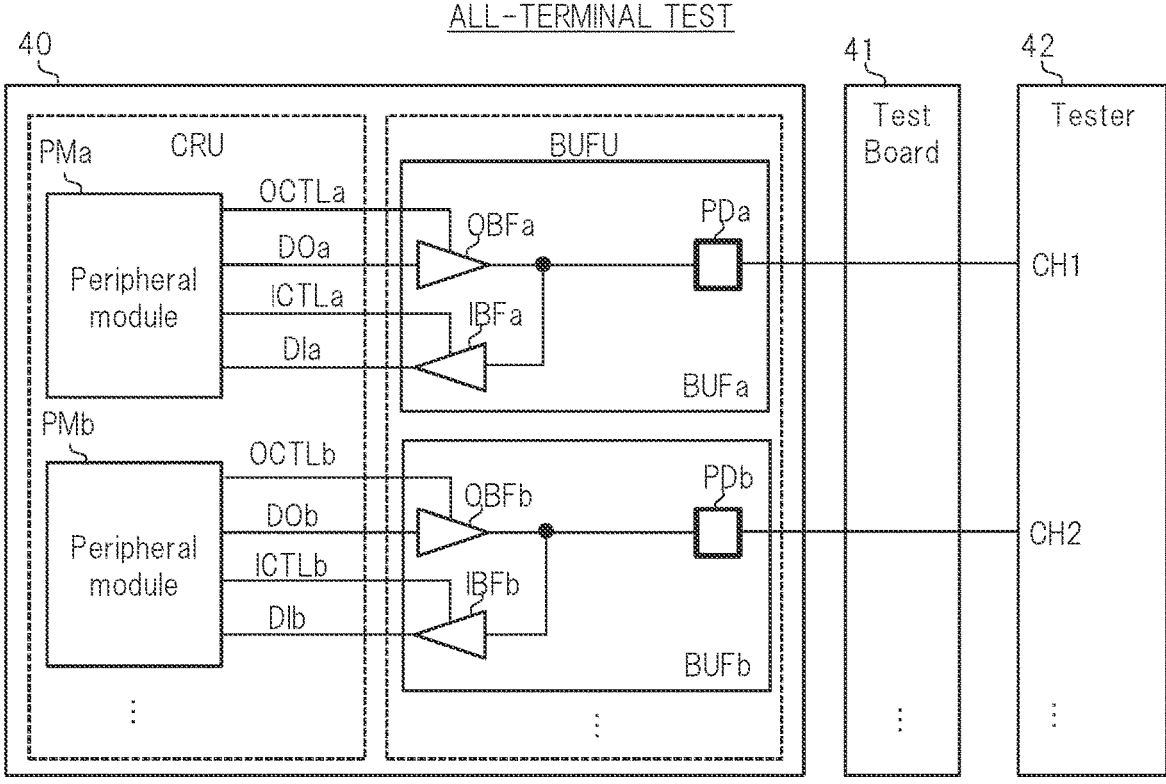
FIG. 15B is a schematic diagram illustrating an example of the all-terminal test.

First, various test methods as the premise will be described. FIG. 15A is a schematic diagram illustrating an example of a small-number-terminal test, and FIG. 15B is a schematic diagram illustrating an example of an all-terminal test. FIGS. 15A and 15B illustrate a semiconductor device 40, a test board 41, an external inspection device 42, and a so-called inspection device that are comparative examples. The semiconductor device 40 includes a buffer unit BUFU including a plurality of buffers BUFa, BUFb, . . . and a core unit CRU including a plurality of peripheral modules PMa, PMb, . . . .

The buffer BUFa includes an external terminal that is a pad PDa in this example, and an input buffer IBFa and an output buffer OBFa that connect the pad PDa and the peripheral module PMa. Similarly, the buffer BUFb includes an external terminal that is a pad PDb in this example, and an input buffer IBFb and an output buffer OBFb that connect the pad PDb and the peripheral module PMb.

Here, in the example of the small-number-terminal test illustrated in FIG. 15A, one channel CH1 included in the external inspection device 42 is connected to a certain external terminal of the semiconductor device 40 that is the pad PDb in this example via wiring on a test board 41. In addition to the peripheral module PMb, the pad PDb is connected to a test circuit (not illustrated) such as a logic BIST circuit, a memory BIST circuit, or a scan chain control circuit. The external inspection device 42 controls the test circuit via the pad PDb to transition the semiconductor device 40 to a test mode, so as to test the peripheral modules PMa, PMb, . . . using the test circuit.

When such a small-number-terminal test is used, it is possible to increase the number of simultaneous measurements, with limited resources, specifically, channels included in the external inspection device 42. For example, the external inspection device 42 is a probe inspection device, and the test board 41 is a probe card. By executing the small-number-terminal test in a wafer test using the probe inspection device, the number of simultaneous measurements of, for example, 256 can be realized. However, in the small-number-terminal test, there is a test item represented by, for example, the test of the buffer BUFa cannot be realized.

Therefore, in addition to the small-number-terminal test, an all-terminal test as illustrated in FIG. 15B is also executed. In the example of FIG. 15B, channels CH1, CH2, . . . included in the external inspection device 42 are connected to the external terminals of the semiconductor device 40, which are the pads PDa, PDb, . . . , in this example, respectively, via the respective wirings on the test board 41. In the all-terminal test, there is no test item that cannot be realized. However, the number of simultaneous measurements is reduced due to the restriction due to the resources of the external inspection device 42.

For example, the external inspection device 42 is a semiconductor inspection device for testing an assembled product, and the test board 41 is a board for an inspection device on which a socket or the like for attachment of the semiconductor device 40 is mounted. When the all-terminal test is executed in the final test using the semiconductor inspection device, the number of simultaneous measurements is, for example, eight.

Figure 16:
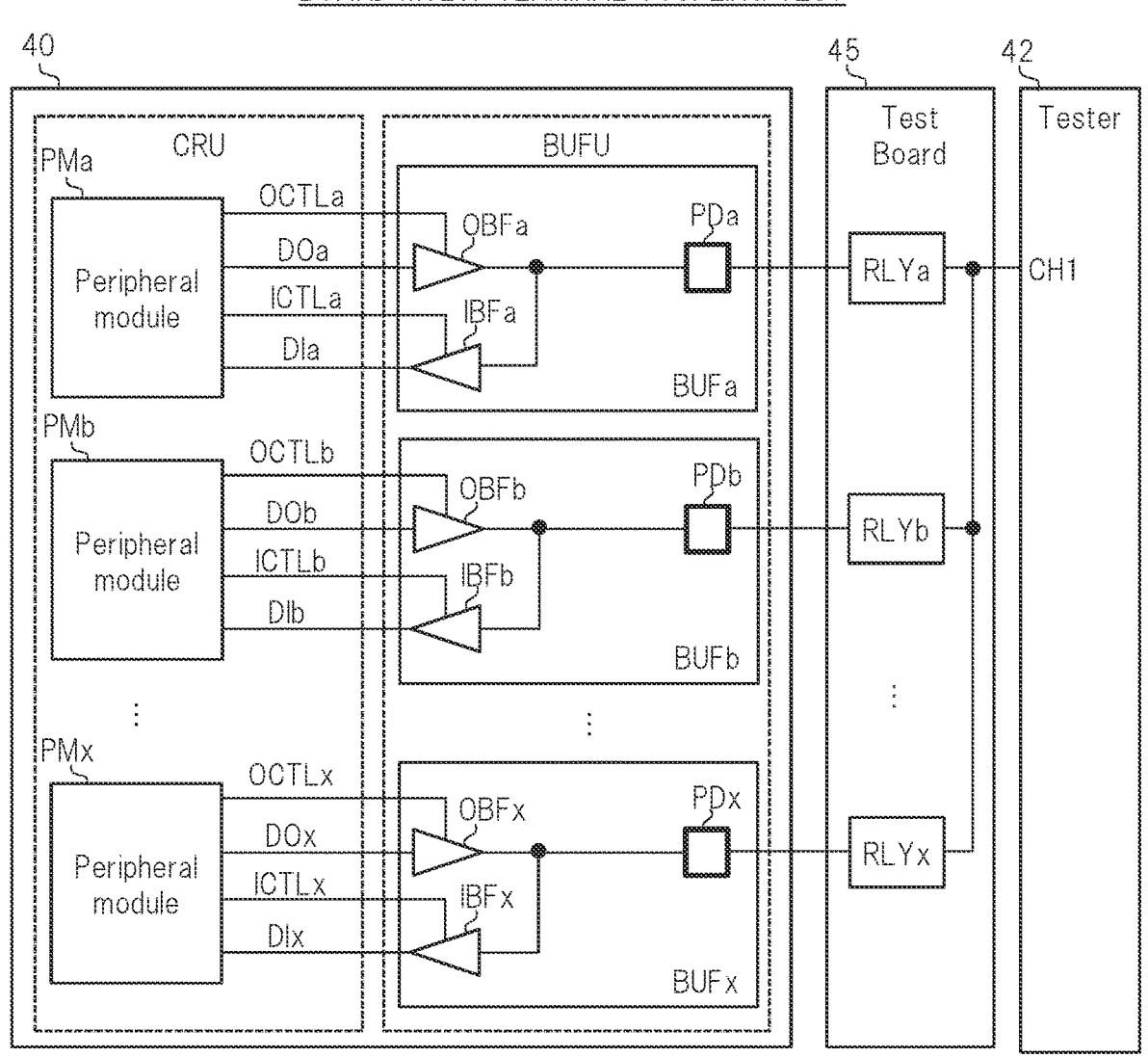
FIG. 16 is a schematic diagram illustrating an example of a multi-terminal coupling test.

In order to increase the number of simultaneous measurements in all-terminal test, the present inventors considered application of a multi-terminal coupling test. FIG. 16 is a schematic diagram illustrating an example of a multi-terminal coupling test. FIG. 16 illustrates a test board 45 different from those in FIG. 15A and the like, in addition to the semiconductor device 40 and the external inspection device 42 similar to those in FIG. 15A and the like. The test board 45 includes a plurality of relays RLYa, RLYb, . . . , and RLYx. One channel CH1 included in the external inspection device 42 is connected to the plurality of pads PDa, PDb, . . . , and PDx on the semiconductor device 40 through branch wiring on the test board 45 and then via the plurality of relays RLYa, RLYb, . . . and RLYx, respectively. The plurality of relays RLYa, RLYb, . . . , and RLYx is controlled by a signal from the external inspection device 42.

As described above, in the multi-terminal coupling test, one channel CH1 is connected to a plurality of external terminals, which are the pads PDa, PDb, . . . in this example, via the plurality of relays RLYa, RLYb, . . . . As a result, for example, a test equivalent to the all-terminal test including test of all buffers can be executed using fewer channels than in the all-terminal test. As a result, the number of simultaneous measurements can be increased.

Note that, in detail, the plurality of external terminals bundled for one channel is, for example, a terminal group that may receive/output signals at different timings, a terminal group that may receive the same signal at the same timing, or the like based on the specification of the semiconductor device 40. In the former case, one channel is connected to one external terminal via only one relay controlled to be on. In the latter case, one channel is connected to the plurality of external terminals via a plurality of relays controlled to be on. By such grouping, the number of channels required for the multi-terminal coupling test may be reduced to about ½ to ⅓ as compared with the case of the all-terminal test. In this case, ideally, the number of simultaneous measurements can be increased from twice to three times.

Figure 17:
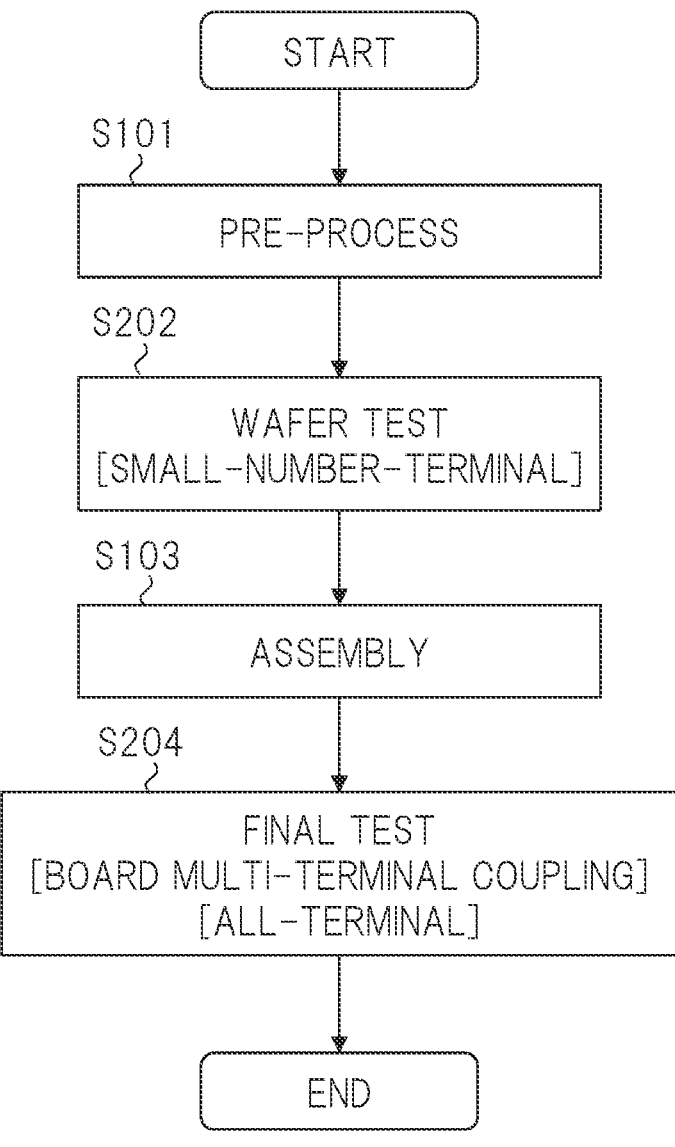
FIG. 17 is a flowchart illustrating an example of a method of manufacturing the semiconductor device that is a comparative example.

FIG. 17 is a flowchart illustrating an example of a method of manufacturing a semiconductor device that is a comparative example. In the flow illustrated in FIG. 17, a pre-process (step S101), a wafer test process (step S202), an assembly process (step S103), and a final test process (step S204) are sequentially performed. In the wafer test process (step S202), the small-number-terminal test illustrated in FIG. 15A is executed. In the final test process (step S204), the multi-terminal coupling test illustrated in FIG. 16 and the all-terminal test as necessary are performed.

However, even when the multi-terminal coupling test as illustrated in FIG. 16 is applied, there is a possibility that the test cost cannot be sufficiently reduced. Specifically, firstly, since the test board 45 on which many relays are mounted is required, the component cost of the test board 45 and the time cost required for development and production of the test board 45 increase. Secondly, it is difficult to apply the multi-terminal coupling test to the wafer test process (step S202). The main reason is that a space for mounting relays cannot be sufficiently secured on the probe card corresponding to the test board 45.

Regarding the second matter, when the multi-terminal coupling test can be applied to the wafer test process in addition to the small-number-terminal test, the test item in the multi-terminal coupling test performed in the final test process (step S204) can be shifted to the wafer test process. In general, in the wafer test process, the number of simultaneous measurements can be increased as compared with the final test process. Therefore, the test cost can be reduced by performing more test items performed by the multi-terminal coupling test in the wafer test process. Therefore, it is advantageous to use the following method.

<Schematic Configuration of Semiconductor Device>

Figure 1:
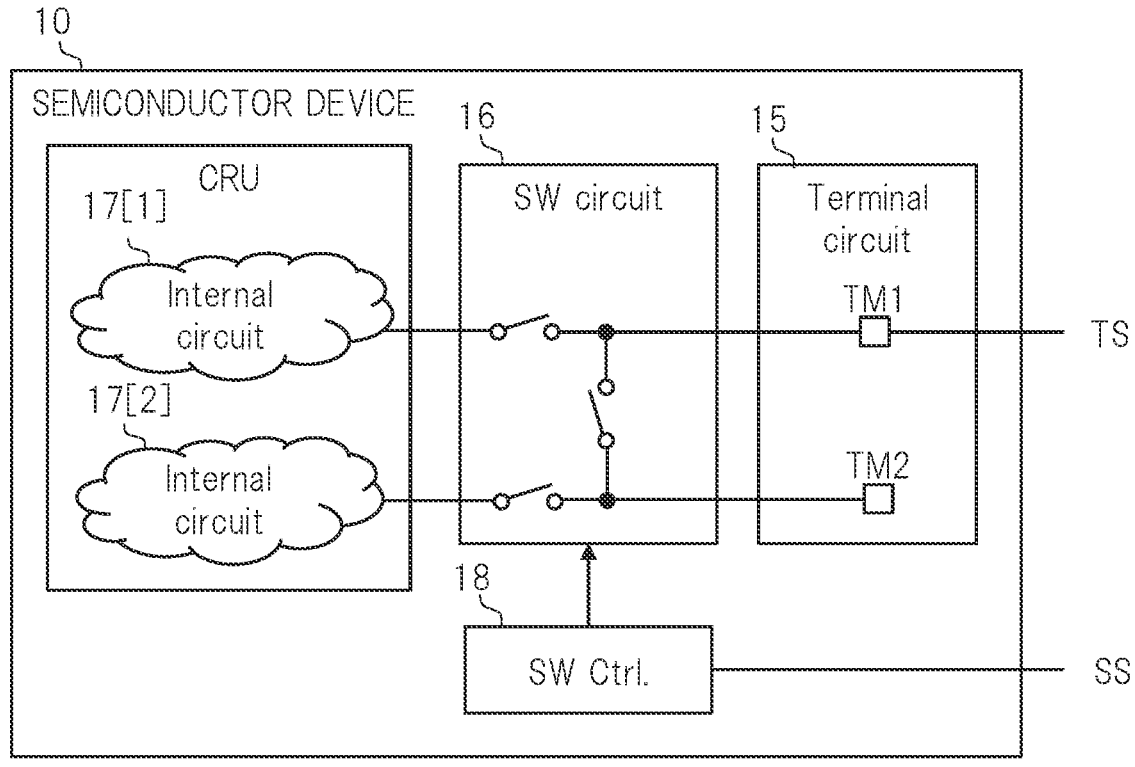
FIG. 1 is a schematic diagram illustrating a configuration example of a main part in a semiconductor device according to a first embodiment.

FIG. 1 is a schematic diagram illustrating a configuration example of a main part of a semiconductor device according to the first embodiment. A semiconductor device 10 illustrated in FIG. 1 is, for example, a microcontroller or an SoC configured by one semiconductor chip. The semiconductor device 10 includes a terminal circuit 15, a switch circuit 16, a core unit CRU, and a switch control circuit 18. The terminal circuit 15 includes a plurality of external terminals, in this example, two external terminals TM1 and TM2. In the specification, the plurality of external terminals is collectively referred to as external terminals TM. Although not illustrated, the terminal circuit 15 may include an electro static discharge (ESD) protection element or the like connected to each external terminal TM1.

The core unit CRU includes an internal circuit 17[1] provided corresponding to the external terminal TM1 and an internal circuit 17[2] provided corresponding to an external terminal TM2. The core unit CRU uses these internal circuits 17[1] and 17[2] to perform signal processing represented by, for example, a logical operation and the like. The switch circuit 16 is inserted on a wiring path between the terminal circuit 15 and the core unit CRU. The switch control circuit 18 controls the switch circuit 16.

Here, the external terminal TM1 is connected to the external inspection device as illustrated in FIG. 16 and the like. Then, the external terminal TM1 receives/outputs a test signal TS from/to the external inspection device. On this assumption, the switch circuit 16 connects the external inspection device to the internal circuit 17[1], the internal circuit 17[2], or both the internal circuits 17[1] and 17[2]. The switch control circuit 18 selects a connection destination of the external inspection device in the switch circuit 16 based on a test setting signal SS from outside, for example, the external inspection device.

As described above, the semiconductor device 10 illustrated in FIG. 1 schematically includes the switch circuit 16 and the switch control circuit 18 unlike the semiconductor device 40 that is a comparative example illustrated in FIG. 16 and the like. As a result, the semiconductor device 10 realizes the multi-terminal coupling test as described referring to FIG. 16 not on the test board 45 but inside the device. In the specification, such a multi-terminal coupling test using the switch circuit 16 or the like is referred to as a device multi-terminal coupling test. On the other hand, a multi-terminal coupling test using the test board 45 as described referring to FIG. 16 is referred to as a board multi-terminal coupling test.

When the device multi-terminal coupling test is used, unlike the board multi-terminal coupling test, it is not necessary to mount many relays on the test board. Therefore, the component cost on the test board and the time cost required for development and production of the test board can be reduced. In addition, the device multi-terminal coupling test can be applied not only to the final test process but also to the wafer test process. As a result, the test cost can be reduced.

Figure 2:
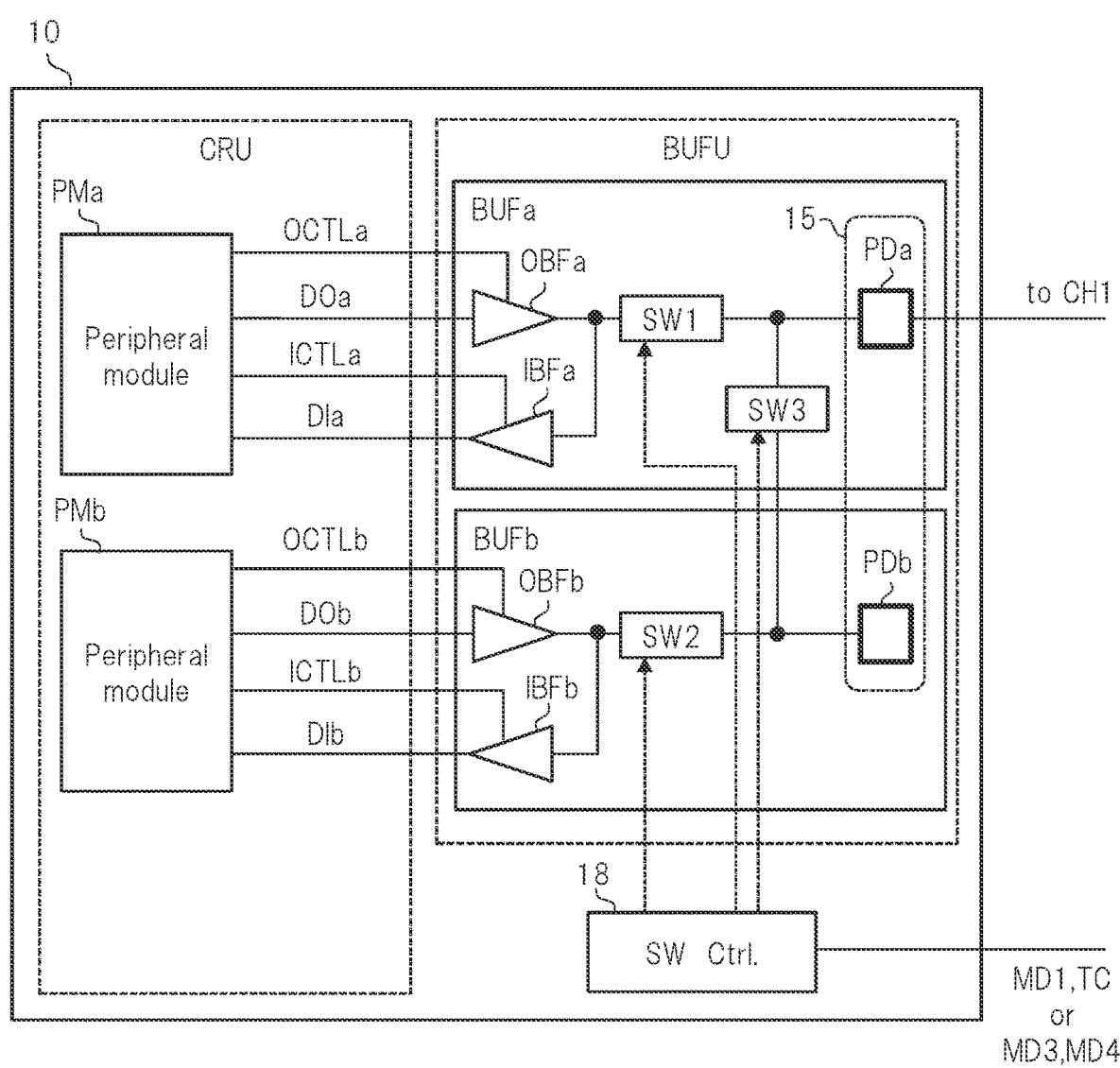
FIG. 2 is a circuit block diagram illustrating a more detailed configuration example of the semiconductor device illustrated in FIG. 1.

FIG. 2 is a circuit block diagram illustrating a more detailed configuration example of the semiconductor device illustrated in FIG. 1. The semiconductor device 10 illustrated in FIG. 2 includes a buffer unit BUFU, the core unit CRU, and the switch control circuit 18. The core unit CRU includes peripheral modules PMa and PMb corresponding to the internal circuits 17[1] and 17[2] in FIG. 1, respectively. The buffer unit BUFU includes two buffers BUFa and BUFb.

The buffer BUFa includes the pad PDa, the input buffer IBFa, and the output buffer OBFa. Similarly, the buffer BUFb includes the pad PDb, the input buffer IBFb, and the output buffer OBFb. The pads PDa and PDb correspond to the external terminals TM1 and TM2 included in the terminal circuit 15 in FIG. 1, respectively.

The input buffer IBFa receives an input signal DIa from the terminal circuit 15 and outputs the input signal DIa to the peripheral module PMa. The output buffer OBFa receives an output signal DOa from the peripheral module PMa and outputs the output signal DOa to the terminal circuit 15. Similarly, the input buffer IBFb receives an input signal DIb from the terminal circuit 15 and outputs the input signal DIb to the peripheral module PMb. The output buffer OBFb receives an output signal DOb from the peripheral module PMb and outputs the output signal DOb to the terminal circuit 15.

Each of the input buffers IBFa and IBFb is, for example, a tristate input buffer. On/off of the input buffer IBFa is controlled by an input control signal ICTLa from the peripheral module PMa. When controlled to be on, the input buffer IBFa outputs the received input signal DIa to the peripheral module PMa. Similarly, on/off of the input buffer IBFb is controlled by an input control signal ICTLb from the peripheral module PMb. When controlled to be on, the input buffer IBFb outputs the received input signal DIb to the peripheral module PMb.

Each of the output buffers OBFa and OBFb is also, for example, a tristate output buffer. On/off of the output buffer OBFa is controlled by an output control signal OCTLa from the peripheral module PMa. When controlled to be on, the output buffer OBFa outputs the output signal DOa from the peripheral module PMa to the terminal circuit 15. Similarly, on/off of the output buffer OBFb is controlled by an output control signal OCTLb from the peripheral module PMb. When controlled to be on, the output buffer OBFb outputs the output signal DOb from the peripheral module PMb to the terminal circuit 15.

Here, the buffer unit BUFU further includes three switches SW1 to SW3 configured by CMOS switches and the like. The three switches SW1 to SW3 are included in the switch circuit 16 in FIG. 1. The switch SW1 connects the pad PDa and the peripheral module PMa. Specifically, the switch SW1 is inserted at an input/output node that is an input node of the input buffer IBFa and an output node of the output buffer OBFa. The switch SW1 connects the pad PDa and the peripheral module PMa via the input buffer IBFa or the output buffer OBFa.

Similarly, the switch SW2 connects the pad PDb and the peripheral module PMb. Specifically, the switch SW2 is inserted at an input/output node that is an input node of the input buffer IBFb and an output node of the output buffer OBFb. The switch SW2 connects the pad PDb and the peripheral module PMb via the input buffer IBFb or the output buffer OBFb. The switch SW3 connects the pad PDa and the pad PDb.

In the example illustrated in FIG. 2, the pad PDa is connected to the channel CH1 of the external inspection device. The switch control circuit 18 receives a mode signal MD1 and a test control signal TC from the external inspection device via a pad (not illustrated), or receives two mode signals MD3 and MD4. The mode signal MD1 and the test control signal TC or the two mode signals MD3 and MD4 correspond to the test setting signal SS in FIG. 1. The switch control circuit 18 selects a connection destination of the external inspection device by controlling on/off of the switches SW1 to SW3 based on the test setting signal SS.

<Details of Switch Circuit and Switch Control Circuit>

FIG. 3A is a diagram illustrating an operation example of the switch control circuit in FIG. 2, and FIG. 3B is a diagram illustrating an operation example different from that in FIG. 3A. FIG. 3A illustrates an operation example of the switch control circuit 18 in a case where the mode signal MD1 and the test control signal TC are used as the test setting signal SS. FIG. 3B illustrates an operation example of the switch control circuit 18 in a case where two mode signals MD1 and MD2 are used as the test setting signal SS.

In FIG. 3A, when the test control signal TC is at level 1, the switch control circuit 18 transitions to one of three test modes PMa-TMD, PMb-TMD, and PMab-TMD based on a 3-bit time-series pattern of the mode signal MD1 that is a serial signal. On the other hand, in FIG. 3B, the switch control circuit 18 transitions to one of the three test modes PMa-TMD, PMb-TMD, and PMab-TMD based on a combination of a plurality of voltage values indicated by the two mode signals MD1 and MD2 that are voltage signals.

In each of the three test modes PMa-TMD, PMb-TMD, and PMab-TMD, a connection destination of the external inspection device is different. Specifically, the test mode PMa-TMD is a test mode for A in which the peripheral module PMa is the connection destination. The test mode PMb-TMD is a test mode for B in which the peripheral module PMb is the connection destination. The test mode PMab-TMD is a test mode for AB in which both peripheral modules PMa and PMb are the connection destinations.

Figure 4A:
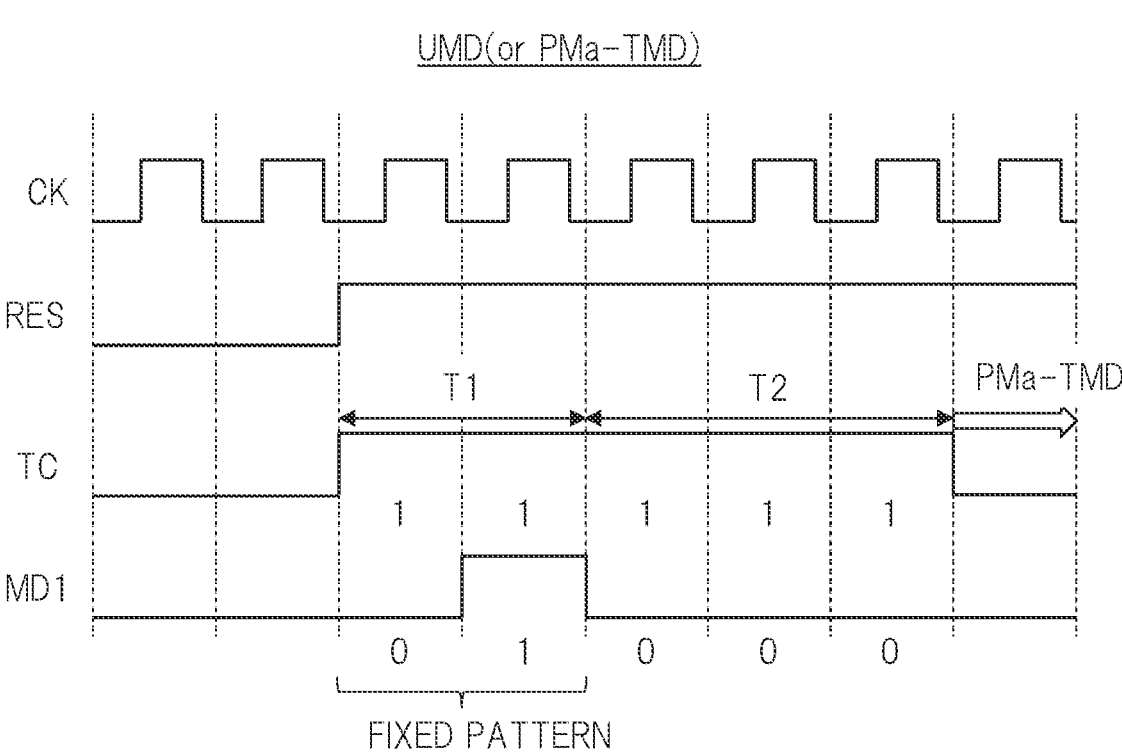
FIG. 4A is a timing chart illustrating an operation example at the time of transition to a test mode for A based on FIG. 3A.
Figure 4B:
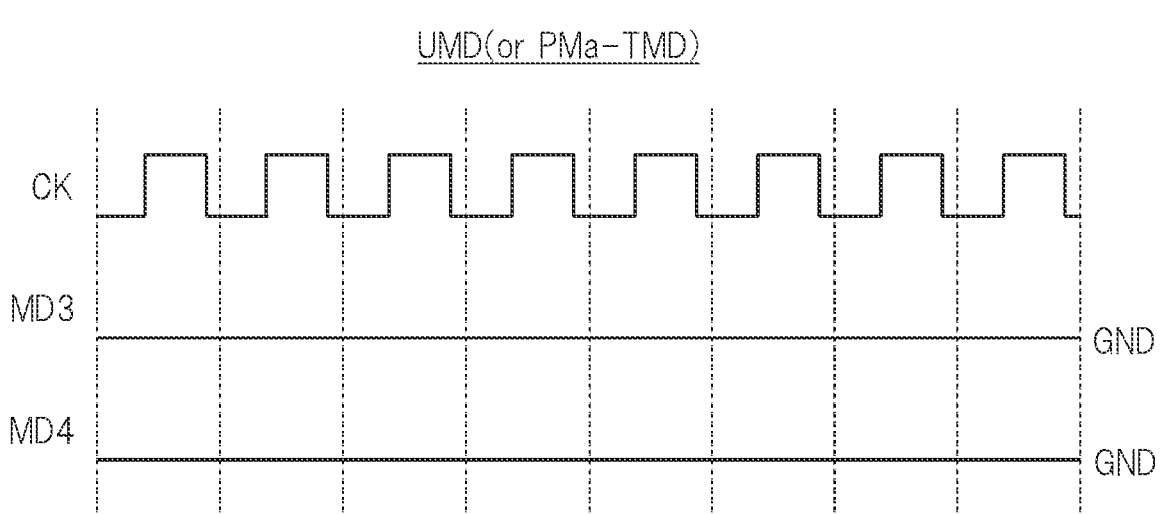
FIG. 4B is a timing chart illustrating an operation example at the time of transition to the test mode for A based on FIG. 3B.
Figure 4C:
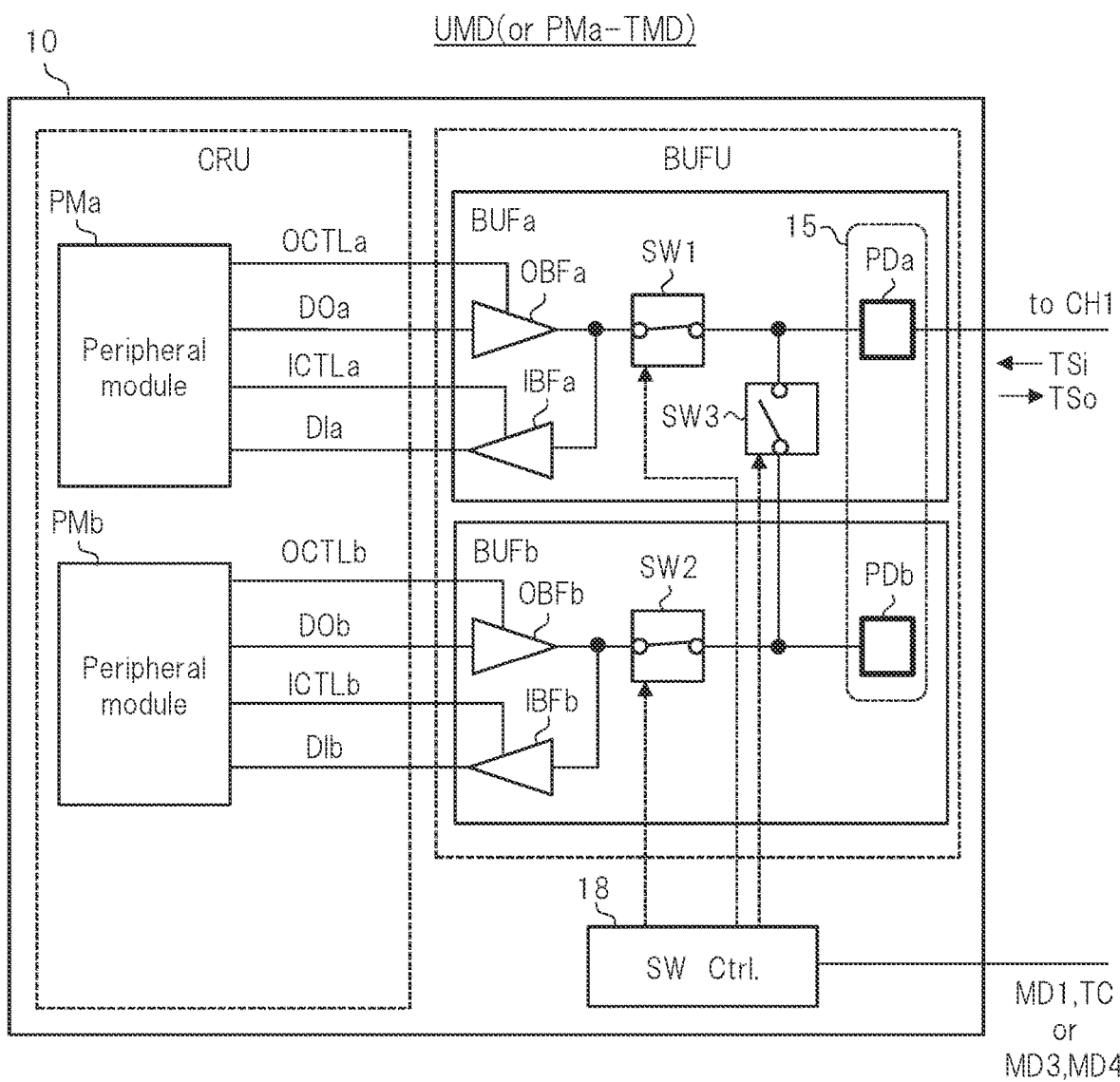
FIG. 4C is a schematic diagram illustrating a state of each switch at the time of transition to the test mode for A in FIGS. 4A and 4B.

FIG. 4A is a timing chart illustrating an operation example at the time of transition to the test mode for A based on FIG. 3A. FIG. 4B is a timing chart illustrating an operation example at the time of transition to the test mode for A based on FIG. 3B. FIG. 4C is a schematic diagram illustrating a state of each switch at the time of transition to the test mode for A in FIGS. 4A and 4B.

In FIG. 4A, a clock signal CK, a reset signal RES, the test control signal TC, and the mode signal MD1 are input from the external inspection device via the external terminal. For example, in a clock period T1 of two cycles after the reset signal RES is released, when the test control signal TC is <1, 1> and the mode signal MD1 is a fixed time-series pattern <0, 1>, the switch control circuit 18 accepts a mode.

Then, in a case where the test control signal TC is <1, 1, 1> and the mode signal MD1 is <0, 0, 0> as illustrated in FIG. 3A in a clock period T2 of three cycles following the clock period T1, the switch control circuit 18 transitions to the test mode PMa-TMD for A. Upon transitioning to the test mode PMa-TMD for A, the switch control circuit 18 controls the switches SW1 and SW2 to be on and controls the switch SW3 to be off as illustrated in FIG. 3A.

On the other hand, in FIG. 4B, the clock signal CK and the two mode signals MD3 and MD4 are input from the external inspection device via the external terminal. In the case where the two mode signals MD3 and MD4 are <GND, GND> as illustrated in FIG. 3B where ground voltage is indicated as GND, the switch control circuit 18 transitions to the test mode PMa-TMD for A. Upon transitioning to the test mode PMa-TMD for A, the switch control circuit 18 controls the switches SW1 and SW2 to be on and controls the switch SW3 to be off as illustrated in FIG. 3B.

In the test mode PMa-TMD for A, as illustrated in FIG. 4C, the channel CH1 is connected to the peripheral module PMa via the pad PDa and the switch SW1, which is on. In addition, the switch SW3 is off. As a result, the channel CH1 outputs a test input signal TSi as the input signal DIa to the peripheral module PMa, and receives the output signal DOa from the peripheral module PMa as a test output signal TSo.

Here, as illustrated in FIGS. 3A and 3B, the semiconductor device in the test mode PMa-TMD for A can be also used as that in a user mode UMD. The user mode UMD is an operation mode in which the semiconductor device 10 is caused to perform a normal operation, that is, an operation mode of the semiconductor device 10 after shipment. Therefore, as illustrated in FIGS. 3A, 3B, and 4C, in the test mode PMa-TMD for A, the switch SW2 is controlled to be on. In the user mode UMD, the pads PDa and PDb are connected to the peripheral modules PMa and PMb via the switches SW1 and SW2, respectively.

For example, in a default state, normally, the test control signal TC in FIG. 4A is fixed to level 0, that is, the ground voltage GND, and the mode signals MD3 and MD4 in FIG. 4B are also fixed to the ground voltage GND. In such a default state, as illustrated in FIGS. 3A, 3B, and 4C, the switch control circuit 18 controls the switches SW1 to SW3 so that the semiconductor device can be used both in the user mode UMD and the test mode PMa-TMD for A. In addition, for example, after the final test process and before shipping the semiconductor device 10, the test control signal TC or the mode signals MD3 and MD4 are fixed in the default state. Accordingly, the switches SW1 and SW2 are fixed to be on and the switch SW3 is fixed to be off, so that it is possible to cause the semiconductor device 10 to perform a normal operation after shipment.

Figure 5A:
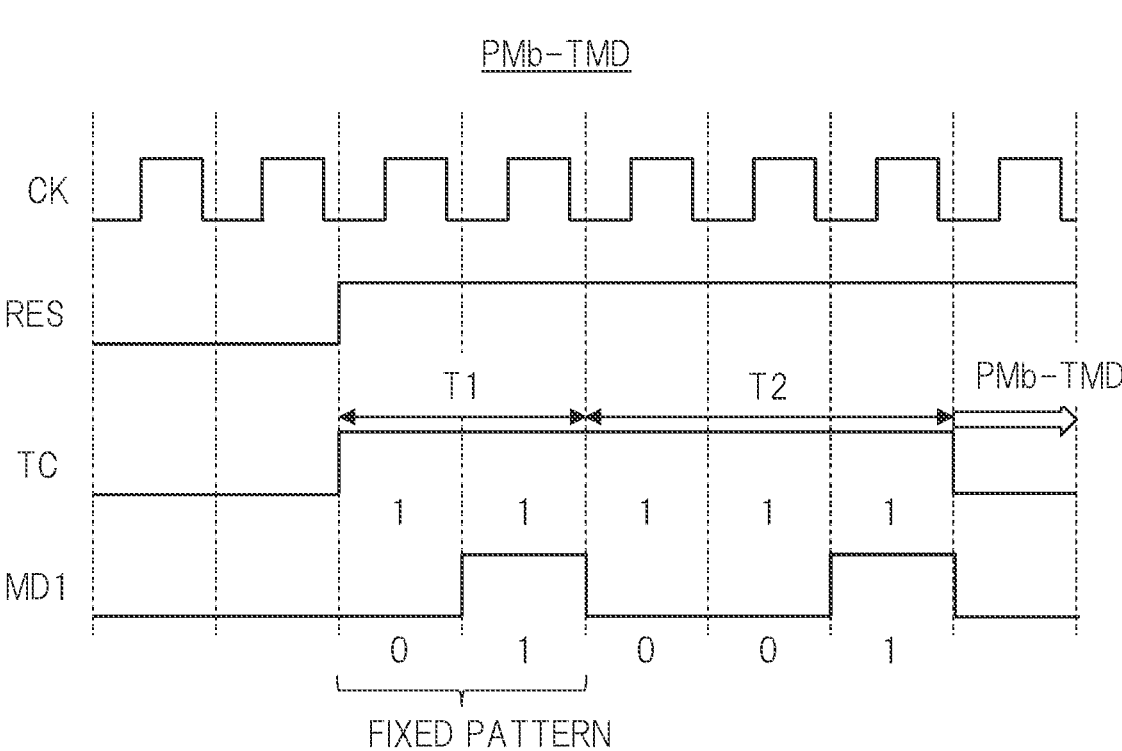
FIG. 5A is a timing chart illustrating an operation example at the time of transition to a test mode for B based on FIG. 3A.
Figure 5B:
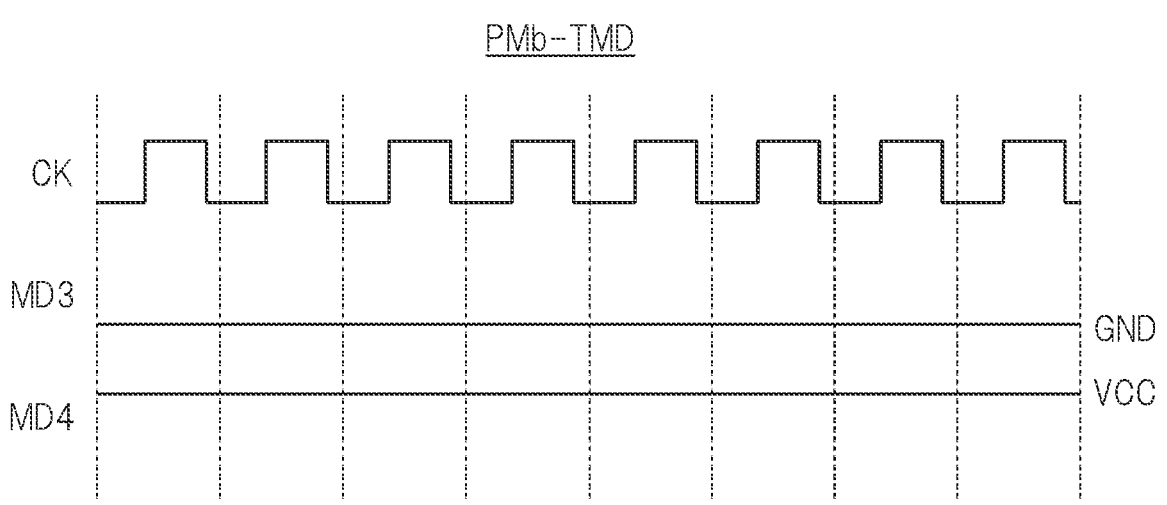
FIG. 5B is a timing chart illustrating an operation example at the time of transition to the test mode for B based on FIG. 3B.
Figure 5C:
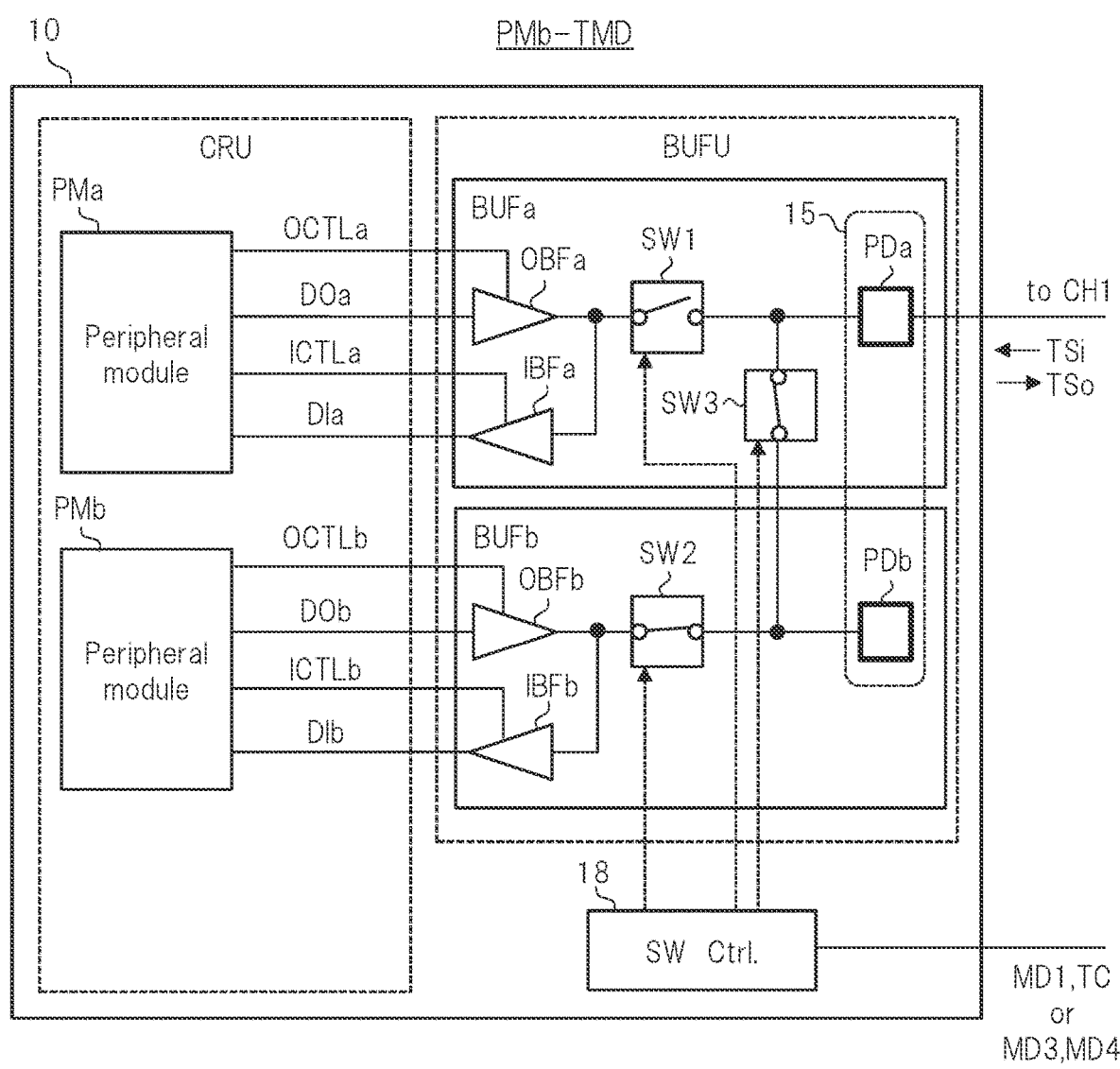
FIG. 5C is a schematic diagram illustrating a state of each switch at the time of transition to the test mode for B in FIGS. 5A and 5B.

FIG. 5A is a timing chart illustrating an operation example at the time of transition to the test mode for B based on FIG. 3A. FIG. 5B is a timing chart illustrating an operation example at the time of transition to the test mode for B based on FIG. 3B. FIG. 5C is a schematic diagram illustrating a state of each switch at the time of transition to the test mode for B in FIGS. 5A and 5B.

In FIG. 5A, similarly to the case of FIG. 4A, the clock signal CK, the reset signal RES, the test control signal TC, and the mode signal MD1 are input from the external inspection device via the external terminal. The switch control circuit 18 accepts the mode after the clock period T1 similar to that in the case of FIG. 4A. Then, in a case where the test control signal TC is <1, 1, 1> and the mode signal MD1 is <0, 0, 1> as illustrated in FIG. 3A in the clock period T2 following the clock period T1, the switch control circuit 18 transitions to the test mode PMb-TMD for B. In the case of transitioning to the test mode PMb-TMD for B, the switch control circuit 18 controls the switch SW1 to be off and controls the switches SW2 and SW3 to be on as illustrated in FIG. 3A.

On the other hand, in FIG. 5B, similarly to the case of FIG. 4B, the clock signal CK and the two mode signals MD3 and MD4 are input from the external inspection device via the external terminal. In the case where the two mode signals MD3 and MD4 are <GND, VCC> as illustrated in FIG. 3B where the power supply voltage is VCC, the switch control circuit 18 transitions to the test mode PMb-TMD for B. Upon transitioning to the test mode PMb-TMD for B, the switch control circuit 18 controls the switch SW1 to be off and controls the switches SW2 and SW3 to be on as illustrated in FIG. 3B.

In the test mode PMb-TMD for B, as illustrated in FIG. 5C, the channel CH1 is connected to the peripheral module PMb via the pad PDa and the switches SW3 and SW2, which are on. In addition, the switch SW1 is off. As a result, the channel CH1 outputs the test input signal TSi as the input signal DIb to the peripheral module PMb, and receives the output signal DOb from the peripheral module PMb as the test output signal TSo.

Figure 6A:
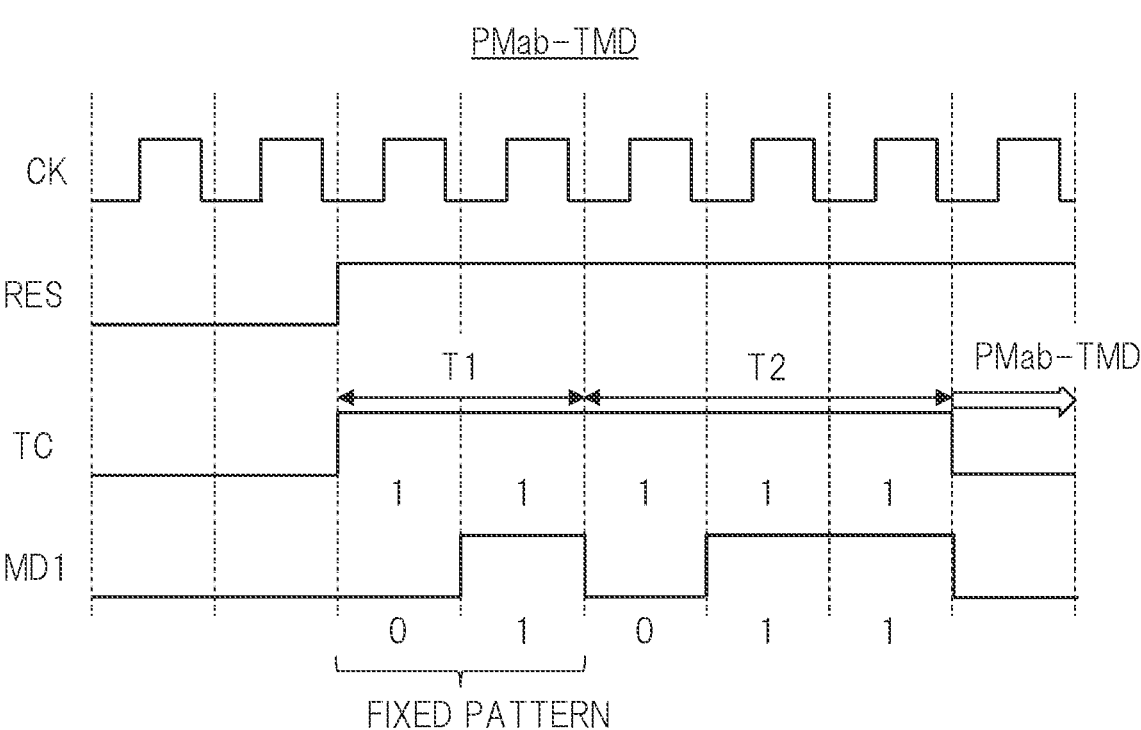
FIG. 6A is a timing chart illustrating an operation example at the time of transition to a test mode for AB based on FIG. 3A.
Figure 6B:
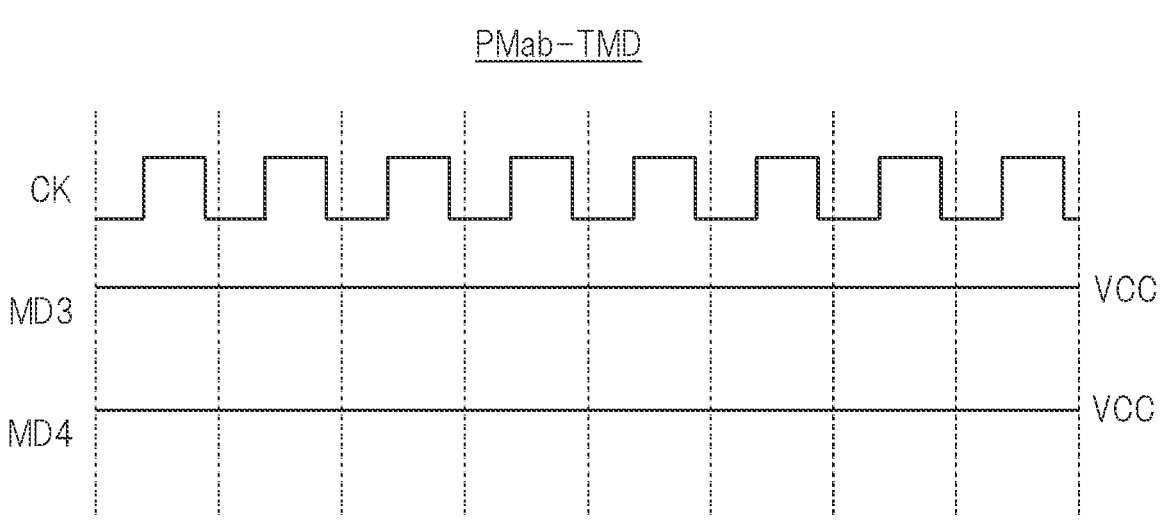
FIG. 6B is a timing chart illustrating an operation example at the time of transition to the test mode for AB based on FIG. 3B.
Figure 6C:
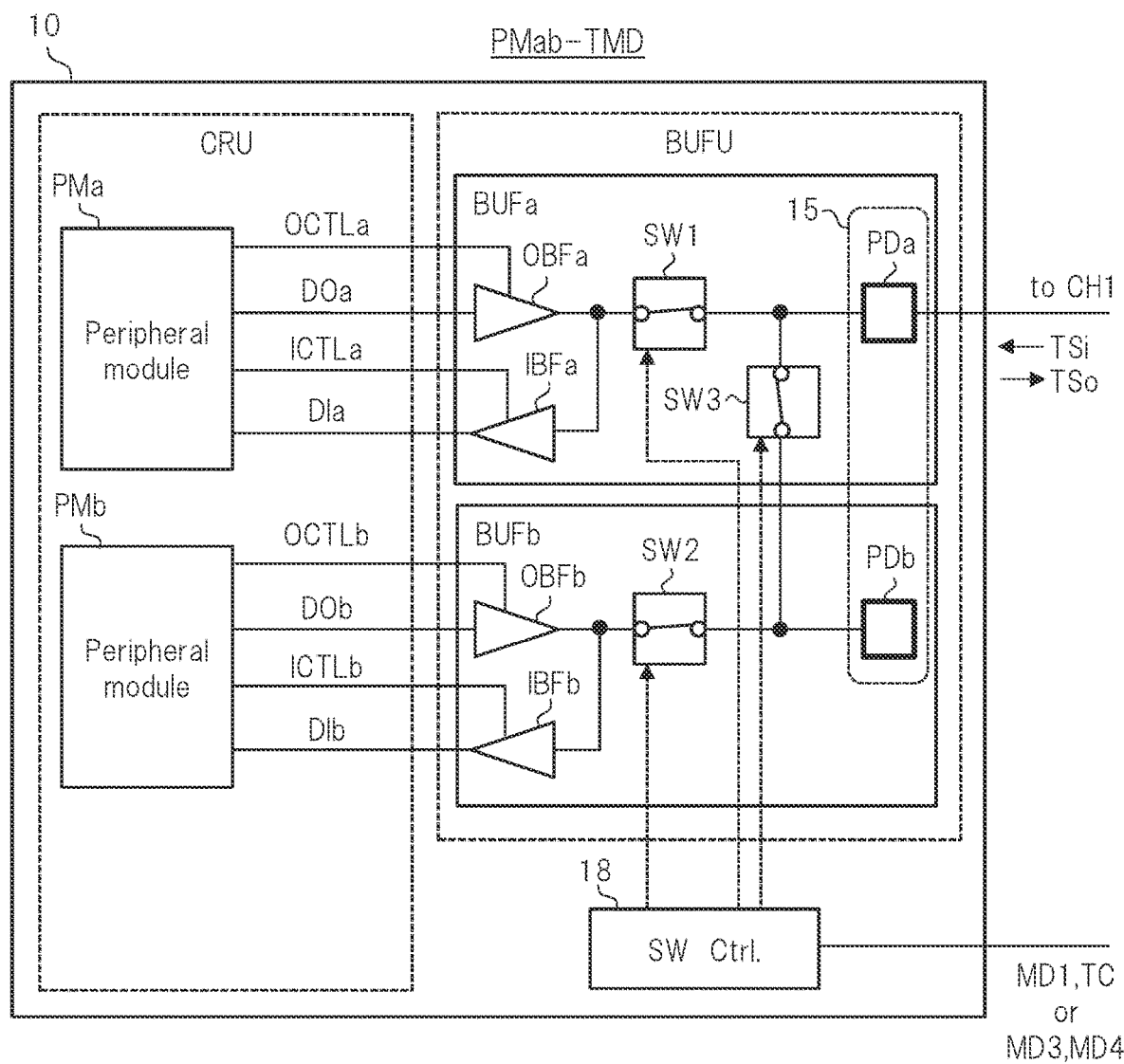
FIG. 6C is a schematic diagram illustrating a state of each switch at the time of transition to the test mode for AB in FIGS. 6A and 6B.

FIG. 6A is a timing chart illustrating an operation example at the time of transition to the test mode for AB based on FIG. 3A. FIG. 6B is a timing chart illustrating an operation example at the time of transition to the test mode for AB based on FIG. 3B. FIG. 6C is a schematic diagram illustrating a state of each switch at the time of transition to the test mode for AB in FIGS. 6A and 6B.

In FIG. 6A, similarly to the case of FIG. 4A, the clock signal CK, the reset signal RES, the test control signal TC, and the mode signal MD1 are input from the external inspection device via the external terminal. The switch control circuit 18 accepts the mode after the clock period T1 similar to that in the case of FIG. 4A. Then, in a case where the test control signal TC is <1, 1, 1> and the mode signal MD1 is <0, 1, 1> as illustrated in FIG. 3A in the clock period T2 following the clock period T1, the switch control circuit 18 transitions to the test mode PMab-TMD for AB. In the case of transitioning to the test mode PMab-TMD for AB, the switch control circuit 18 controls all the switches SW1 to SW3 to be on as illustrated in FIG. 3A.

On the other hand, in FIG. 6B, similarly to the case of FIG. 4B, the clock signal CK and the two mode signals MD3 and MD4 are input from the external inspection device via the external terminal. In the case where the two mode signals MD3 and MD4 are <VCC, VCC> as illustrated in FIG. 3B, the switch control circuit 18 transitions to the test mode PMab-TMD for AB. Upon transitioning to the test mode PMab-TMD for AB, the switch control circuit 18 controls all the switches SW1 to SW3 to be on as illustrated in FIG. 3B.

In the test mode PMab-TMD for AB, as illustrated in FIG. 6C, the channel CH1 is connected to the peripheral modules PMa and PMb via the pad PDa and the switches SW1 to SW3, which are on. As a result, the channel CH1 can output the same test input signal TSi to the peripheral modules PMa and PMb. However, when both the peripheral modules PMa and PMb output the output signals DOa and DOb, signal contention occurs. Therefore, the test mode PMab-TMD for AB is applied to, for example, the external terminal TM dedicated for input.

Note that, in a case where the test control signal TC and the mode signal MD1 as illustrated in FIG. 3A are used as the test setting signal SS, even in a case where the number of test modes increases, and then the number of external terminals TM to be bundled increases, only one mode signal MD1 is needed. As a result, there is no need to increase the number of external terminals required for the test setting signal SS. However, it is necessary to secure resources, that is, channels, for outputting the test control signal TC and the mode signal MD1, in the external inspection device.

On the other hand, in a case where a plurality of mode signals MD3 and MD4 are used as the test setting signal SS as illustrated in FIG. 3B, it is not always necessary to secure resources in the external inspection device by, for example, setting a fixed voltage value by wiring on the test board. However, in a case where the number of test modes increases, and then the number of external terminals TM to be bundled increases, it is necessary to increase the number of mode signals, and then, the number of external terminals required for the test setting signal SS.

<Method of Manufacturing Semiconductor Device>

Figure 7:
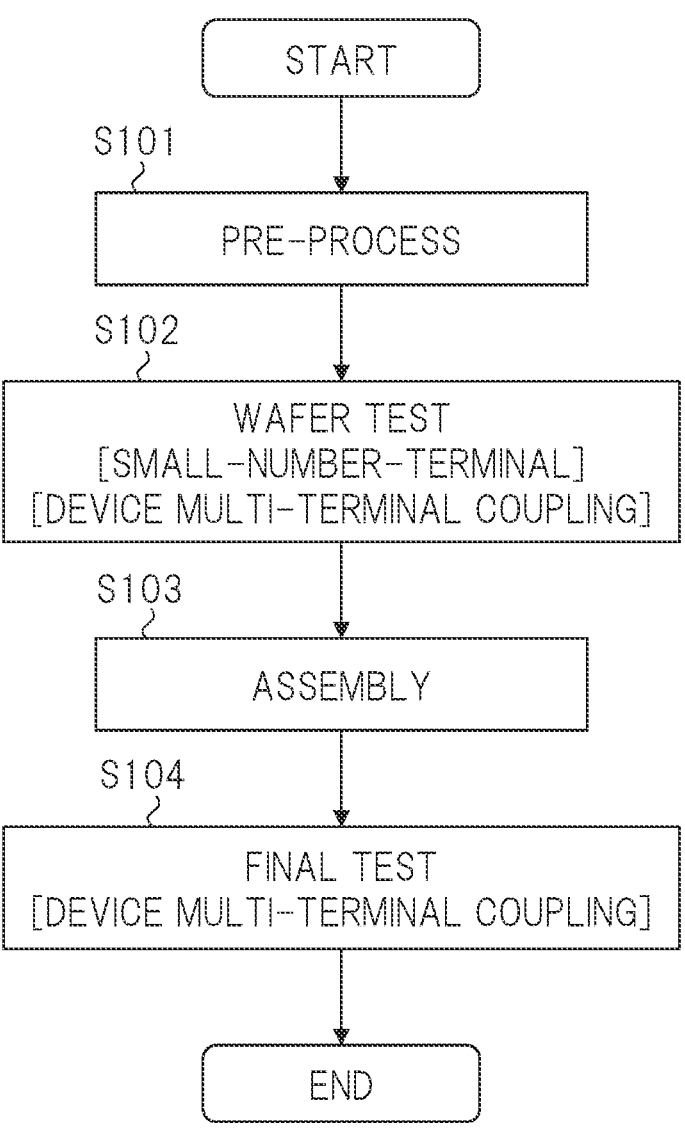
FIG. 7 is a flowchart illustrating an example of a method of manufacturing the semiconductor device for the semiconductor device illustrated in FIGS. 1 and 2.

FIG. 7 is a flowchart illustrating an example of a method of manufacturing a semiconductor device for the semiconductor device illustrated in FIGS. 1 and 2. In FIG. 7, a pre-process (step S101), a wafer test process (step S102), an assembly process (step S103), and a final test process (step S104) are sequentially performed. In the pre-process (step S101), various semiconductor manufacturing apparatuses form, on a semiconductor wafer, a plurality of the semiconductor devices 10 as illustrated in FIGS. 1 and 2, in other words, a plurality of semiconductor chips.

In the wafer test process (step S102), the probe inspection device tests the plurality of semiconductor devices 10 formed on the semiconductor wafer. In the assembly process (step S103), the various assembling apparatuses separate the plurality of semiconductor devices 10 individually from the semiconductor wafer, and package the plurality of individually separated semiconductor devices 10. In the final test process (step S104), the semiconductor inspection device tests each of the plurality of assembled semiconductor devices 10.

Here, in the wafer test process (step S102), the probe inspection device executes the device multi-terminal coupling test in addition to the small-number-terminal test unlike the comparative example illustrated in FIG. 17. That is, in the device multi-terminal coupling test, the probe inspection device outputs the test setting signal SS to the switch control circuit 18 to output the test input signal TSi to the external terminal TM1, or receives the test output signal TSo from the external terminal TM1.

In addition, in the final test process (step S104), the semiconductor inspection device executes the device multi-terminal coupling test instead of the board multi-terminal coupling test illustrated in FIG. 17. In this case, unlike the case of FIG. 17, it is not necessary to mount many relays on the test board, so that the component cost can be reduced, and the development period and the production period of the board can be shortened.

Furthermore, in FIG. 7, for example, about 40% to 60% of the test items of the board multi-terminal coupling test that would be performed in the final test process (step S204) in FIG. 17 may be able to be shifted to the wafer test process (step S102). For example, most of the test time in the wafer test process (step S102) is occupied by a memory test requiring a relatively long time. Therefore, an increase in the test time in the wafer test process (step S102) by shifting the test items is not particularly problematic. On the other hand, by shifting the test items, the test time in the final test process (step S104) can be significantly shortened.

Modifications

Figure 8:
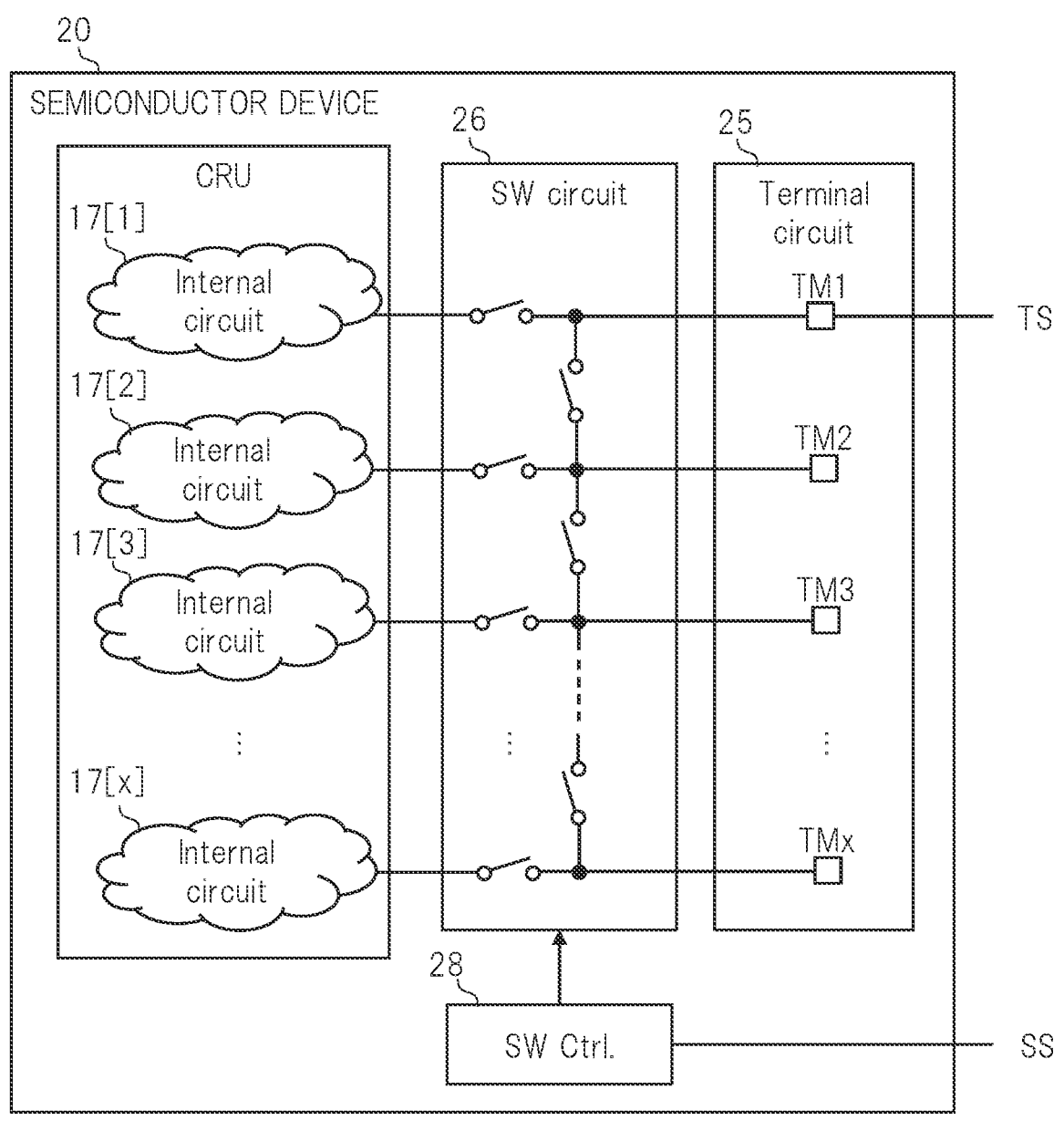
FIG. 8 is a schematic diagram illustrating a configuration example obtained by extending the configuration illustrated in FIG. 1.

FIG. 8 is a schematic diagram illustrating a configuration example obtained by extending the configuration illustrated in FIG. 1. A semiconductor device 20 illustrated in FIG. 8 includes a terminal circuit 25, a switch circuit 26, a core unit CRU, and a switch control circuit 28 similarly to the case of FIG. 1. The terminal circuit 25 includes three or more external terminals TM1, TM2, . . . , and TMx including the external terminals TM illustrated in FIG. 1. Similarly, the core unit CRU also includes three or more internal circuits 17[1], 17[2], . . . , 17[x] including the internal circuits illustrated in FIG. 1. The switch circuit 26 connects the external inspection device to any one or all of the three or more internal circuits 17[1], 17[2], . . . , 17[x] in a state where the external inspection device is connected to the external terminal TM1. As described above, the number of branches by the switch circuit 26 may be three or more.

Main Effects of First Embodiment

As described above, in a method of the first embodiment, the switch circuit 16 and the switch control circuit 18 for executing the device multi-terminal coupling test are provided in the semiconductor device 10. By executing the multi-terminal coupling test, the number of simultaneous measurements can be increased, so that the test time can be shortened. Furthermore, by executing, in particular, the device multi-terminal coupling test among the multi-terminal coupling tests, the component cost of the test board can be reduced, and the development period and the manufacturing period of the board can be shortened. Furthermore, by executing the device multi-terminal coupling test, the multi-terminal coupling test can be applied to the wafer test process. As a result, the test cost can be reduced.

Second Embodiment

<Schematic Configuration of Semiconductor Device>

Figure 9:
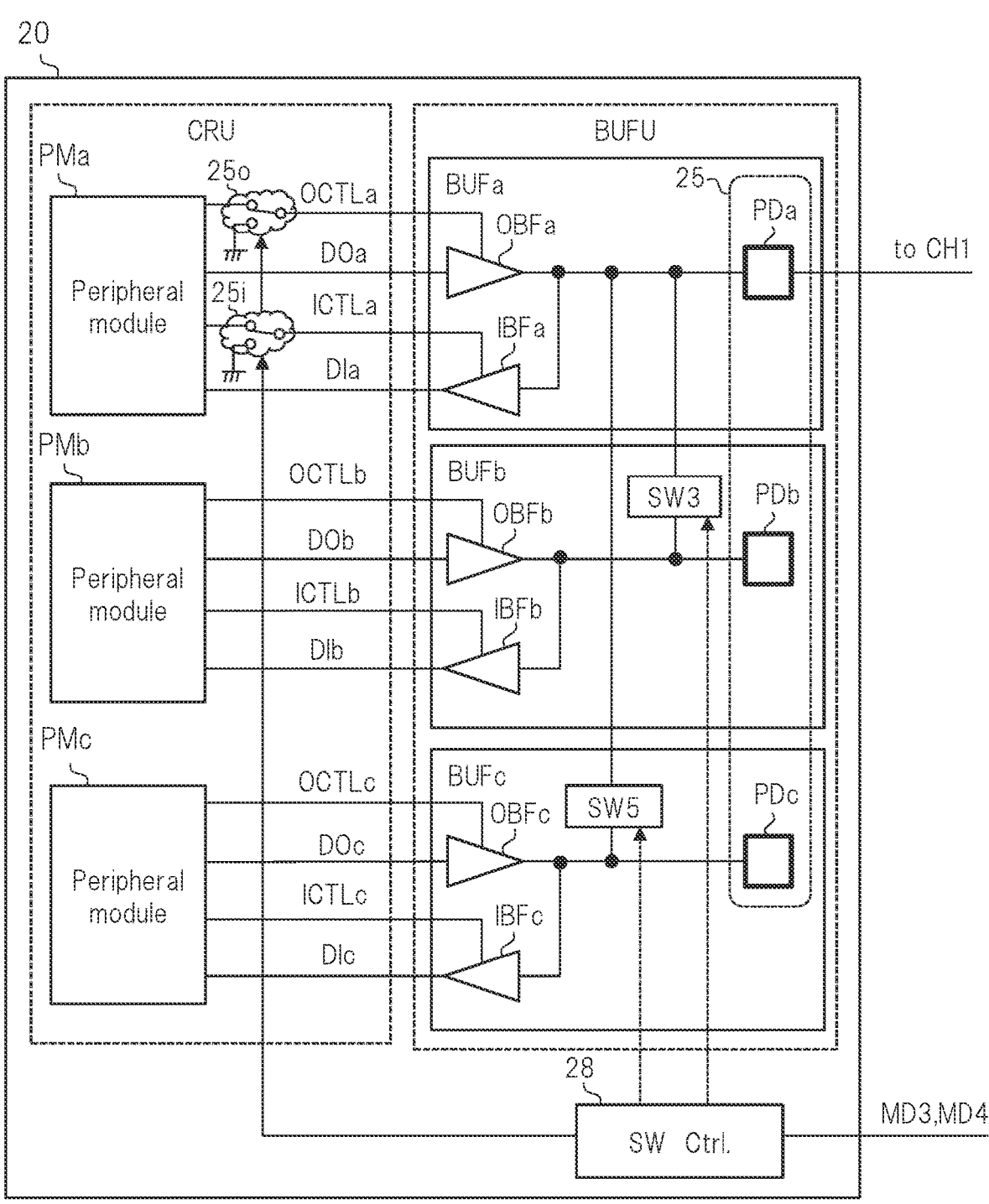
FIG. 9 is a circuit block diagram illustrating a more detailed configuration example of the semiconductor device illustrated in FIG. 8 in the semiconductor device according to a second embodiment.

FIG. 9 is a circuit block diagram illustrating a more detailed configuration example of the semiconductor device illustrated in FIG. 8 in a semiconductor device according to a second embodiment. The semiconductor device 20 illustrated in FIG. 9 is different as compared with the configuration example illustrated in FIG. 2 in the following points. As a first different point, a buffer BUFc is added in the buffer unit BUFU, and a peripheral module PMc is added in the core unit CRU.

As a second different point, the switches SW1 and SW2 are not provided in the buffer unit BUFU, and switching logic circuits 250 and 25*i* are provided in the core unit CRU instead of the switch SW1. As a third different point, a switch SW5 is provided in the buffer unit BUFU in addition to the switch SW3 similar to that in the case of FIG. 2. As a fourth different point, the switch control circuit 28 controls the switching logic circuits 250 and 25*i* in addition to the switches SW3 and SW5.

The buffer BUFc includes a pad PDc, an input buffer IBFc, and an output buffer OBFc, similarly to the buffer BUFa and the like. On/off of the input buffer IBFc is controlled by an input control signal ICTLc from the peripheral module PMc. When controlled to be on, the input buffer IBFc outputs an input signal DIc from the terminal circuit 25 to the peripheral module PMc. On/off of the output buffer OBFc is controlled by an output control signal OCTLC from the peripheral module PMc. When controlled to be on, the output buffer OBFc outputs an output signal DOc from the peripheral module PMc to the terminal circuit 25.

The switch SW5 connects the pad PDa and the pad PDc. The switching logic circuit 25*i* outputs the input control signal ICTLa from the peripheral module PMa to the input buffer IBFa, or fixes the input control signal ICTLa to be the off level, here, the ground voltage GND. Similarly, the switching logic circuit 250 outputs the output control signal OCTLa from the peripheral module PMa to the output buffer OBFa, or fixes the output control signal OCTLa to be the off level, here, the ground voltage GND. Note that, the switching logic circuits 25*i* and 250 are realized by, for example, a logic gate such as a switch or an AND gate.

<Details of Switch Circuit and Switch Control Circuit>

FIG. 10 is a diagram illustrating an operation example of the switch control circuit 28 in FIG. 9. Here, an example in which two mode signals MD3 and MD4 are used as the test setting signal SS is illustrated, but of course, the test control signal TC and the mode signal MD1 may be used. In FIG. 10, the switch control circuit 28 causes the switching logic circuits 25*i* and 250 to select the input control signal ICTLa and the output control signal OCTLa from the peripheral module PMa at the time of transition to the user mode UMD or the test mode PMa-TMD for A. Furthermore, the switch control circuit 28 controls the switches SW3 and SW5 to be off.

At the time of transition to the test mode PMb-TMD for B, the switch control circuit 28 fixes the input control signal ICTLa and the output control signal OCTLa to be the off level via the switching logic circuits 25*i* and 25*o*. Furthermore, the switch control circuit 28 controls the switch SW3 to be on and controls the switch SW5 to be off. Similarly, at the time of transition to a test mode PMc-TMD for C in which the peripheral module PMc is to be tested, the switch control circuit 28 controls the switch SW5 instead of the switch SW3 to be on.

On the other hand, at the time of transition to a test mode PMabc-TMD for ABC in which all the peripheral modules PMa, PMb, and PMc are to be tested, the switch control circuit 28 causes the switching logic circuit 25*i* to select the input control signal ICTLa from the peripheral module PMa. In addition, the switch control circuit 28 fixes the output control signal OCTLa to be the off level via the switching logic circuit 250. Furthermore, the switch control circuit 28 controls the switches SW3 and SW5 to be on.

The test mode PMabc-TMD for ABC is applied to, for example, the external terminal TM dedicated for input similarly to the case of the first embodiment. Therefore, the output control signal OCTLa is fixed to be the off level. However, in some cases, by causing the switching logic circuit 250 to select the output control signal OCTLa from the peripheral module PMa, it is also possible to execute a test in which the output signal DOa from the peripheral module PMa is input to the peripheral modules PMb and PMc.

Note that, in the examples of FIGS. 9 and 10, the switching logic circuits 25*i* and 250 are provided for the peripheral module PMa in order to simplify the description, but in detail, the switching logic circuits are also provided for the peripheral modules PMb and PMc. In addition, in the configuration example of FIG. 9, as can be understood from the operation described with reference to FIG. 10, the switch SW1 illustrated in FIG. 2 is realized by a tristate buffer in FIG. 9, that is, the input buffer IBFa and the output buffer OBFa. Similarly, the switch SW2 illustrated in FIG. 2 is realized by the input buffer IBFb and the output buffer OBFb in FIG. 9.

Main Effects of Second Embodiment

As described above, also by using a method of the second embodiment, effects similar to the various effects described in the first embodiment can be obtained. Furthermore, since some switches SW1 and SW2 are realized by using the tristate buffers, an increase in the circuit area in the semiconductor device 20 can be suppressed. That is, in general, the core unit CRU can reduce the size of the circuit element as compared with the buffer unit BUFU. Therefore, an increase in the circuit area can be suppressed.

Third Embodiment

<Schematic Configuration of Semiconductor Device>

Figure 11:
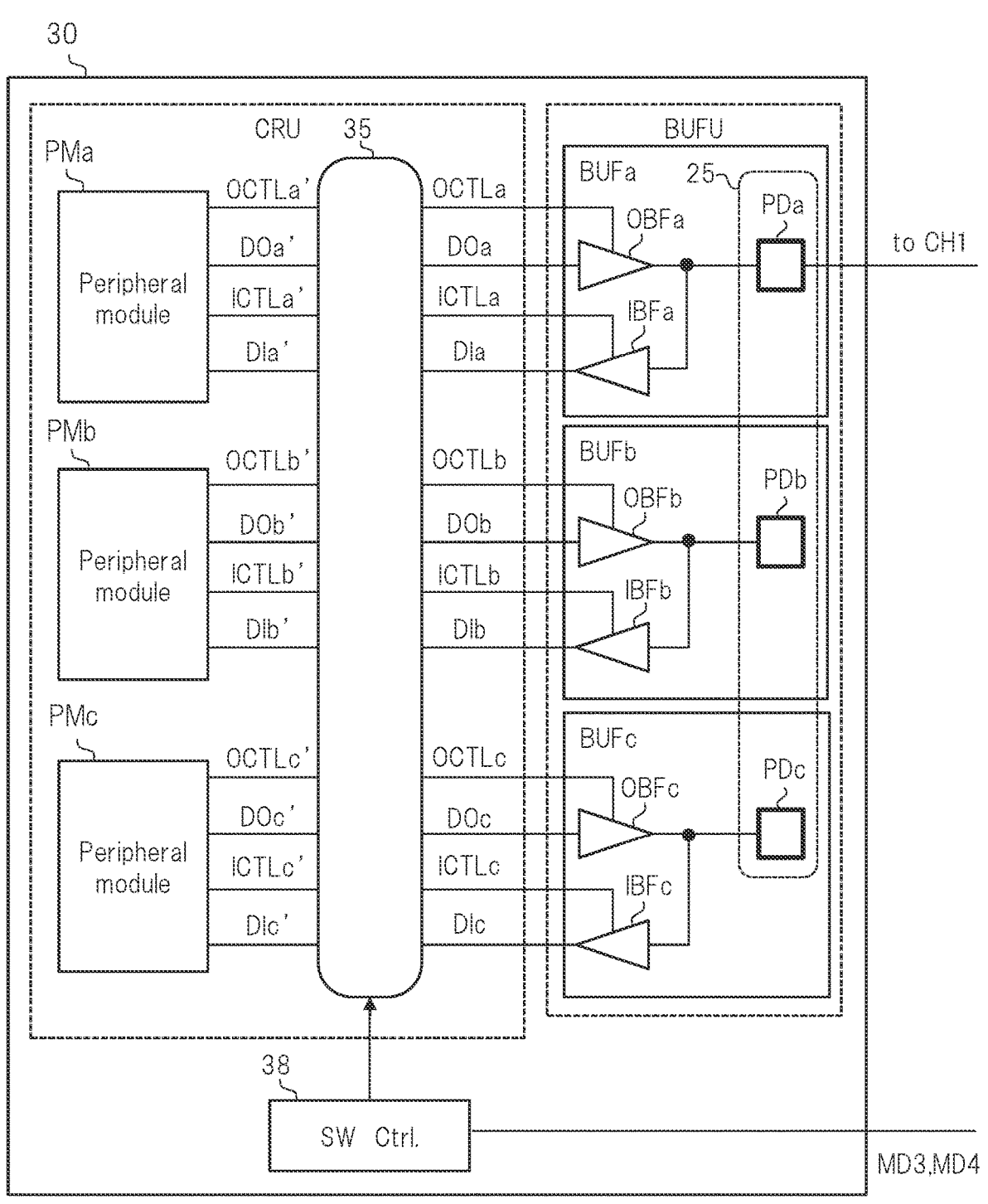
FIG. 11 is a circuit block diagram illustrating a more detailed configuration example of the semiconductor device illustrated in FIG. 8 in the semiconductor device according to a third embodiment.

FIG. 11 is a circuit block diagram illustrating a more detailed configuration example of the semiconductor device illustrated in FIG. 8 in a semiconductor device according to a third embodiment. A semiconductor device 30 illustrated in FIG. 11 is different as compared with the configuration example illustrated in FIG. 9 in the following points. As a first different point, no switch including the switches SW3 and SW5 is provided in the buffer unit BUFU. Accordingly, the input buffers IBFa, IBFb, and IBFc receive input signals from the pads PDa, PDb, and PDc, respectively. In addition, the output buffers OBFa, OBFb, and OBFc output output signals to the pads PDa, PDb, and PDc, respectively.

As a second different point, instead of switches that are not in the buffer unit BUFU, a switching logic circuit 35 is provided in the core unit CRU. The switching logic circuit 35 is realized by, for example, a switch or a combination circuit, that is, a combination of logic gates, and has the function of the switch circuit 26 illustrated in FIG. 8. The switching logic circuit 35 is inserted into wiring paths between the peripheral modules PMa, PMb, and PMc and the input buffers IBFa, IBFb, and IBFc and between the peripheral modules PMa, PMb, and PMc and the output buffers OBFa, OBFb, and OBFc. A switch control circuit 38 controls the switching logic circuit 35.

In the example illustrated in FIG. 11, by inserting the switching logic circuit 35, for example, an input control signal ICTLa' from the peripheral module PMa and the input control signal ICTLa to the input buffer IBFa are separated. In addition, the input signal DIa from the input buffer IBFa and an input signal DIa' to the peripheral module PMa are also separated. In the specification, the input control signal from the peripheral module PMa is referred to as a pre-stage input control signal ICTLa', and the input control signal to the input buffer IBFa is referred to as a post-stage input control signal ICTLa. The input signal from the input buffer IBFa is referred to as a pre-stage input signal DIa, and the input signal to the peripheral module PMa is referred to as a post-stage input signal DIa'.

Similarly, an output control signal OCTLa' from the peripheral module PMa and the output control signal OCTLa to the output buffer OBFa are separated. In addition, an output signal DOa' from the peripheral module PMa and the output signal DOa to the output buffer OBFa are also separated. In the specification, the output control signal from the peripheral module PMa is referred to as a pre-stage output control signal OCTLa', and the output control signal to the output buffer OBFa is referred to as a post-stage output control signal OCTLa. The output signal from the peripheral module PMa is referred to as a pre-stage output signal DOa', and the output signal to the output buffer OBFa is referred to as a post-stage output signal DOa. The same applies to the other peripheral modules PMb and PMc.

<Details of Switch Circuit and Switch Control Circuit>

Figure 13A:
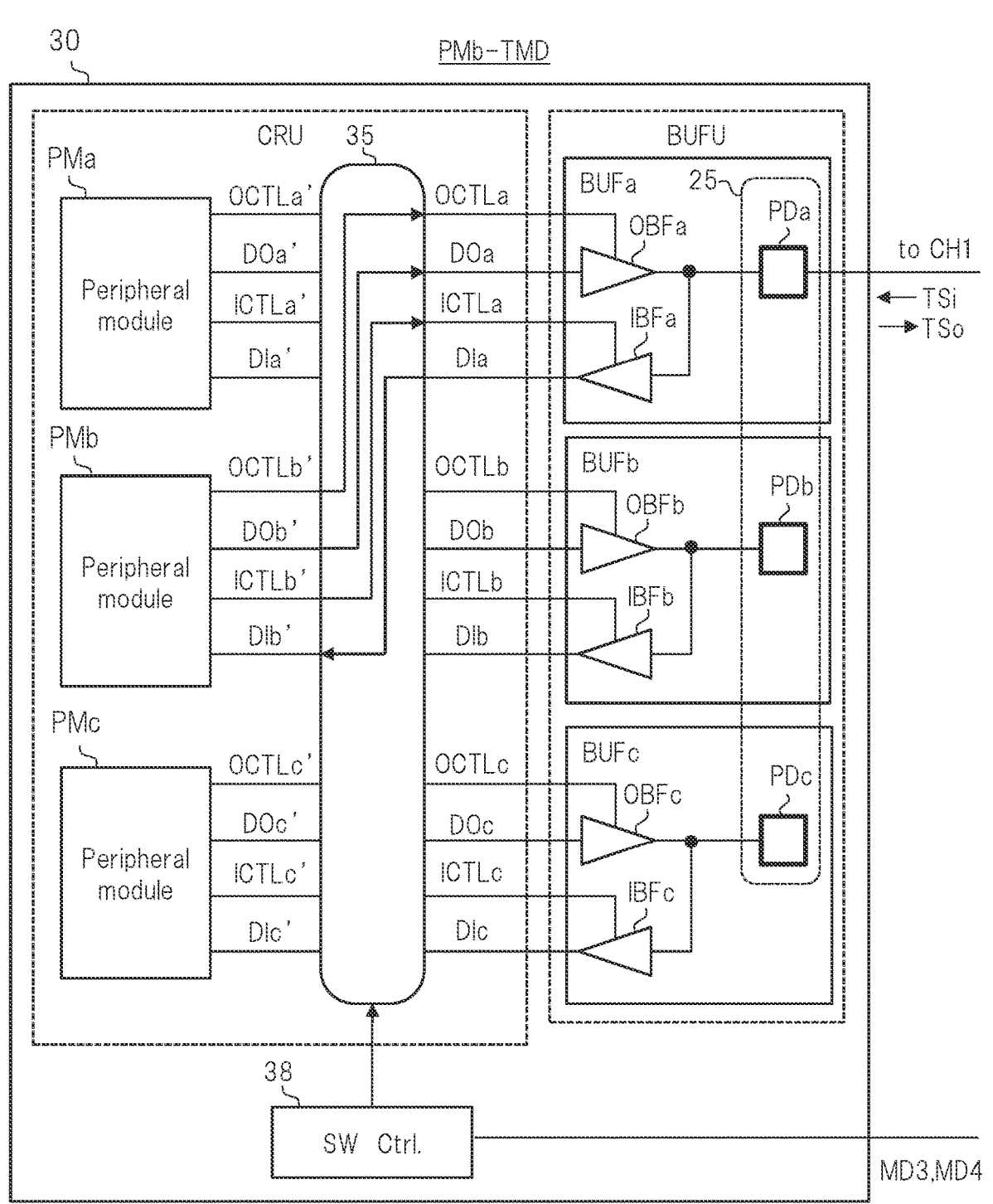
FIG. 13A is a schematic diagram illustrating an operation state of a switching logic circuit at the time of transition to the test mode for B in FIG. 12.
Figure 13B:
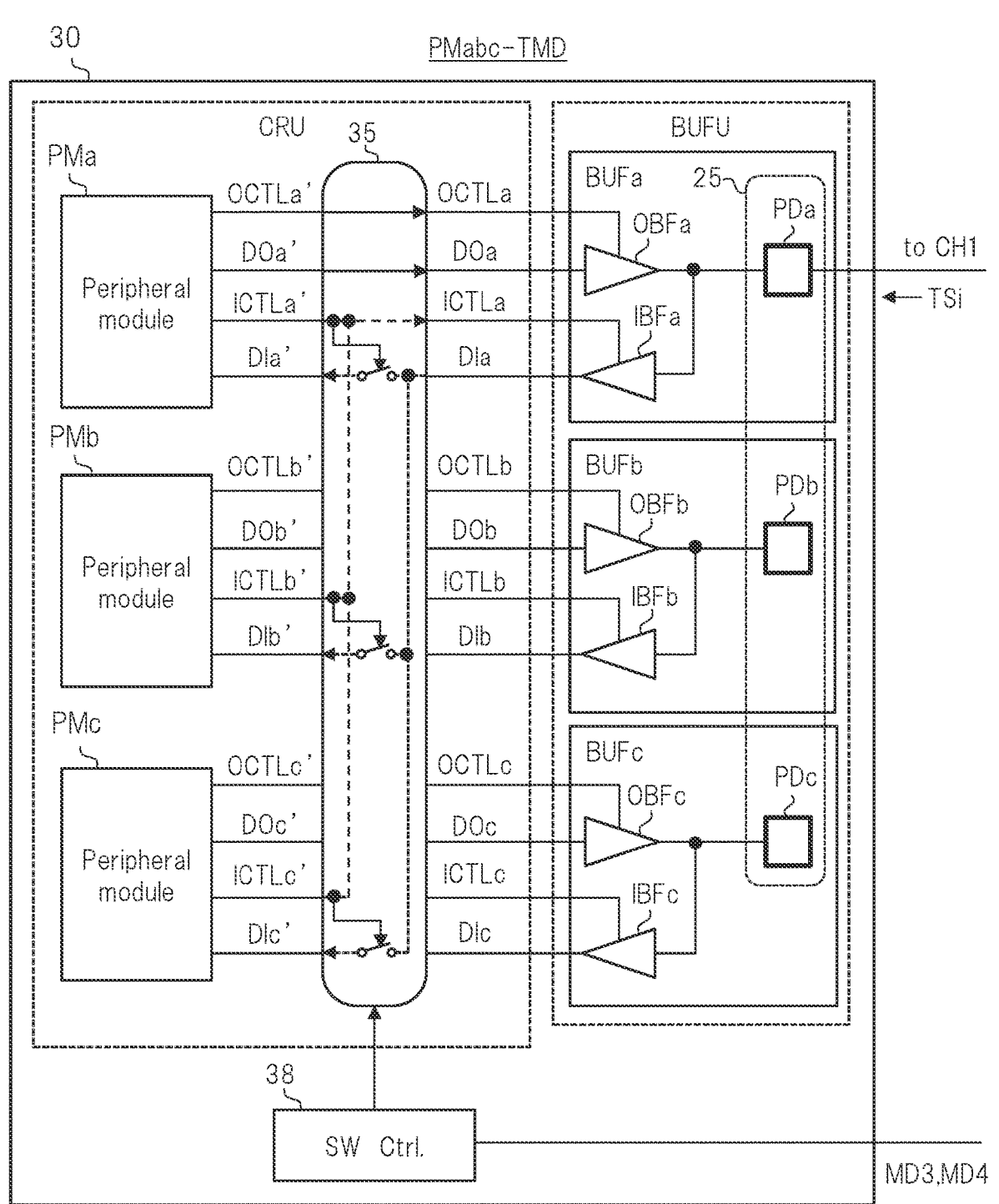
FIG. 13B is a schematic diagram illustrating an operation state of the switching logic circuit at the time of transition to the test mode for ABC in FIG. 12.

FIG. 12 is a diagram illustrating an operation example of the switch control circuit and the switching logic circuit in FIG. 11. Here, an example in which two mode signals MD3 and MD4 are used as the test setting signal SS is illustrated, but of course, the test control signal TC and the mode signal MD1 may be used. FIG. 13A is a schematic diagram illustrating an operation state of the switching logic circuit at the time of transition to the test mode for B in FIG. 12. FIG. 13B is a schematic diagram illustrating an operation state of the switching logic circuit at the time of transition to the test mode for ABC in FIG. 12.

In the case of transitioning to the test mode PMb-TMD for B, the switch control circuit 38 controls the switching logic circuit 35 to a state as illustrated in FIG. 13A. In FIG. 13A, the switching logic circuit 35 connects a pre-stage input control signal ICTLb' and a pre-stage output control signal OCTLb' from the peripheral module PMb to the post-stage input control signal ICTLa of the input buffer IBFa and the post-stage output control signal OCTLa of the output buffer OBFa, respectively. In addition, the switching logic circuit 35 connects the pre-stage input signal DIa from the input buffer IBFa to the post-stage input signal DIb' to the peripheral module PMb, and connects the pre-stage output signal DOb' from the peripheral module PMb to the post-stage output signal DOa to the output buffer OBFa.

Also in the case of transitioning to the test mode PMa-TMD for A or to the test mode PMc-TMD for C, as illustrated in FIG. 12, a state similar to that in the case of FIG. 13A is formed. That is, in FIG. 13A, in the test mode PMa-TMD for A, a connection destination of the input buffer IBFa and the output buffer OBFa is the peripheral module PMa. In the test mode PMc-TMD for C, a connection destination of the input buffer IBFa and the output buffer OBFa is the peripheral module PMc.

On the other hand, in the case of transitioning to the test mode PMabc-TMD for ABC, the switch control circuit 38 controls the switching logic circuit 35 to a state as illustrated in FIG. 13B. In FIG. 13B, the switching logic circuit 35 connects the pre-stage input control signals ICTLa', and ICTLb', and a pre-stage input control signal ICTLc' from the peripheral modules PMa, PMb, and PMc to the post-stage input control signal ICTLa, to the input buffer IBFa by an OR logic.

In addition, the switching logic circuit 35 connects the pre-stage input signal DIa from the input buffer IBFa to the post-stage input signals DIa', DIb', and DIc', to the peripheral modules PMa, PMb, and PMc, respectively, via the three switches. The three switches are controlled by the corresponding pre-stage input control signals ICTLa', ICTLb', and ICTLc'. As a result, for example, the peripheral module PMa outputs the pre-stage input control signal ICTLa', and receives the pre-stage input signal DIa associated therewith as the post-stage input signal DIa'. In addition, the peripheral module PMb outputs the pre-stage input control signal ICTLb', and receives the pre-stage input signal DIa associated therewith as the post-stage input signal DIb'.

<Method of Manufacturing Semiconductor Device>

Figure 14:
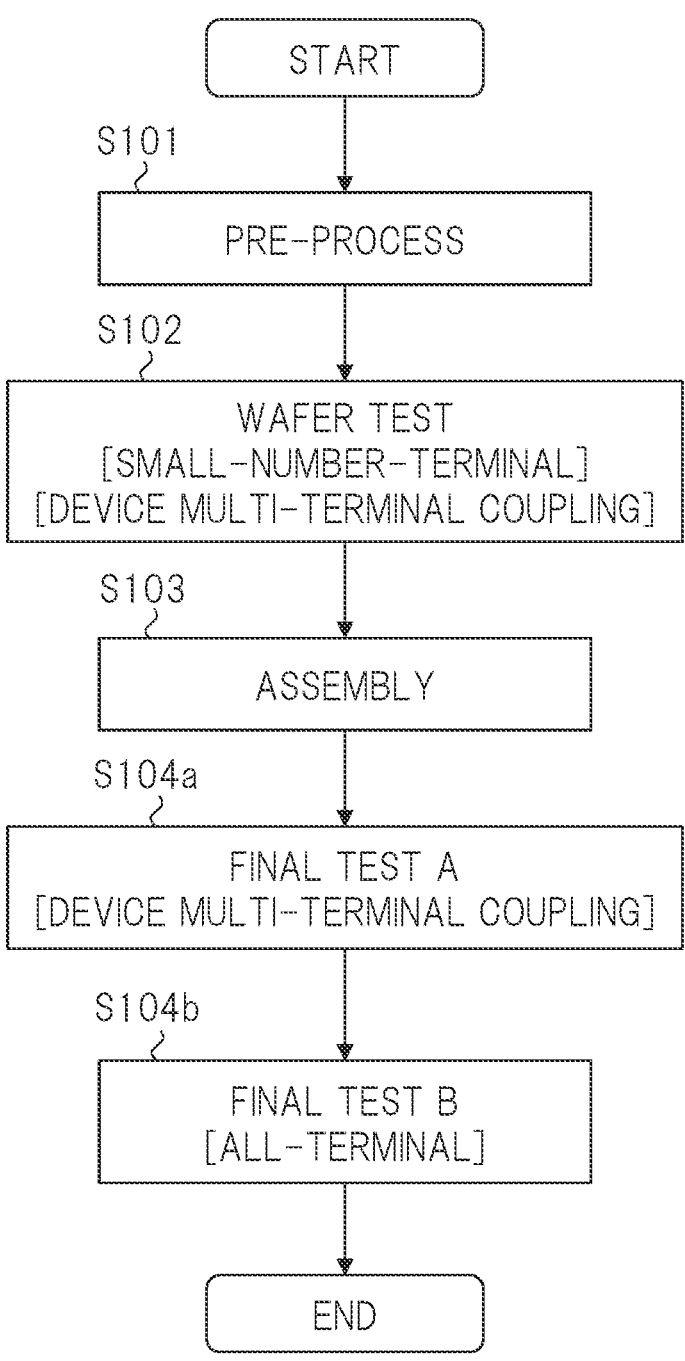
FIG. 14 is a flowchart illustrating an example of a method of manufacturing the semiconductor device for the semiconductor device illustrated in FIG. 11.

FIG. 14 is a flowchart illustrating an example of a method of manufacturing a semiconductor device for the semiconductor device illustrated in FIG. 11. The flow illustrated in FIG. 14 is different from the flow illustrated in FIG. 7 in that the method has two final test steps (steps S104a and S104b). In the final test process (step S104a), the device multiterminal coupling test is executed similarly to the case of FIG. 7.

However, the semiconductor device 30 illustrated in FIG. 11 is different from the semiconductor device 10 illustrated in FIG. 2 in that, for example, as illustrated in FIG. 13A, the input buffers IBFb and IBFc and the output buffers OBFb and OBFc corresponding to the peripheral modules PMb and PMc do not operate. Therefore, in the final test process (step S104b), a test around the external terminal TM including a buffer is executed using the all-terminal test. Specifically, an open/short test, a leak test, a test of input/output characteristics, and the like are executed. Note that, such a test around the external terminal TM is a test usually executed for various products commonly using similar test specifications. Therefore, the test may be executed, for example, by providing a common general-purpose test board that does not depend on a product.

Main Effects of Third Embodiment

As described above, also by using a method of the third embodiment, effects similar to the various effects described in the first embodiment can be obtained. Furthermore, by providing the entire switch circuit 26 in the core unit CRU, it is possible to further suppress an increase in the circuit area in the semiconductor devices 20 and 30 as compared with the case of the second embodiment.

Although the invention made by the present inventors has been specifically described based on the embodiments, the present invention is not limited to the above embodiments, and it goes without saying that various modifications can be made without departing from the scope of the present invention.

What is claimed is:

1. A semiconductor device comprising:
a terminal circuit including a first external terminal and a second external terminal, wherein the first external terminal is configured to receive a test input signal from an external inspection device;
a core unit that includes a first internal circuit provided corresponding to the first external terminal and a second internal circuit provided corresponding to the second external terminal, and performs signal processing, using at least one of the first internal circuit and the second internal circuit, on the test input signal received by at least one of the first internal circuit and the second internal circuit via the first external terminal to generate a test output signal, the test output signal being output to the external inspection device via the first external terminal;
a switch circuit disposed on a wiring path between the terminal circuit and the core unit, wherein, when the external inspection device is connected to the first external terminal, the switch circuit selectively connects the first external terminal to the first internal circuit, the second internal circuit, or both the first internal circuit and the second internal circuit; and
a switch control circuit that receives a test setting signal from the external inspection device and controls ON and OFF of one or more switches included in the switch circuit based on the test setting signal to select a connection destination of the external inspection device in the switch circuit.

2. The semiconductor device according to claim 1,
wherein the test setting signal is a serial signal, and
wherein the switch control circuit selects the connection destination of the external inspection device based on a time-series pattern of the serial signal.

3. The semiconductor device according to claim 1,
wherein the test setting signal is a plurality of voltage signals, and
wherein the switch control circuit selects the connection destination of the external inspection device based on a combination of a plurality of voltage values indicated by the plurality of voltage signals.

4. The semiconductor device according to claim 1, wherein the one or more switches in the switch circuit include:
a first switch that connects the first external terminal and the first internal circuit;
a second switch that connects the second external terminal and the second internal circuit; and
a third switch that connects the first external terminal and the second external terminal.

5. The semiconductor device according to claim 4, wherein the switch circuit controls the first switch and the second switch to be on and controls the third switch to be off in a case where the semiconductor device is operated normally.

6. The semiconductor device according to claim 4, further comprising:
a first input buffer that receives an input signal from the terminal circuit and outputs the input signal to the first internal circuit; and
a second input buffer that receives an input signal from the terminal circuit and outputs the input signal to the second internal circuit,
wherein the first switch is inserted into an input node of the first input buffer, and

wherein the second switch is inserted into an input node of the second input buffer.

7. The semiconductor device according to claim 4, further comprising:

a first tristate input buffer that receives an input signal from the terminal circuit, outputs the input signal to the first internal circuit, and is controlled to be on/off by a first input control signal; and a second tristate input buffer that receives an input signal from the terminal circuit, outputs the input signal to the second internal circuit, and is controlled to be on/off by a second input control signal, wherein the first switch is realized by the first tristate input buffer, wherein the second switch is realized by the second tristate input buffer, and wherein the switch control circuit fixes the first input control signal to be an off level when the external inspection device is connected to the second internal circuit.

8. The semiconductor device according to claim 1, further comprising:

a first tristate input buffer that receives an input signal from the first external terminal, outputs the input signal to the core unit, and is controlled to be on/off by a first post-stage input control signal; and a second tristate input buffer that receives an input signal from the second external terminal, outputs the input signal to the core unit, and is controlled to be on/off by a second post-stage input control signal, wherein the first internal circuit outputs a first pre-stage input control signal and receives a first post-stage input signal associated with the first pre-stage input control signal, wherein the second internal circuit outputs a second pre-stage input control signal and receives a second post-stage input signal associated with the second pre-stage input control signal, and wherein, when the external inspection device is connected to the second internal circuit, the switch control circuit connects the second pre-stage input control signal to the first post-stage input control signal, and connects a first pre-stage input signal from the first tristate input buffer to the second post-stage input signal.

9. The semiconductor device according to claim 1, wherein the terminal circuit includes three or more external terminals including the first external terminal and the second external terminal, wherein the core unit includes three or more internal circuits including the first internal circuit and the second internal circuit, and wherein the switch circuit connects the external inspection device to any one or all of the three or more internal circuits in a state where the external inspection device is connected to the first external terminal.

10. A method of manufacturing a semiconductor device, the method comprising:

a pre-process of forming a plurality of semiconductor devices on a semiconductor wafer;

a wafer test process of testing the plurality of semiconductor devices using a probe inspection device;

an assembly process of separating the plurality of semiconductor devices individually from the semiconductor wafer and packaging the individually separated plurality of semiconductor devices; and

a final test process of testing the assembled plurality of semiconductor devices using a semiconductor inspection device, wherein the pre-process includes forming, in each of the plurality of semiconductor devices:

a terminal circuit including a first external terminal and a second external terminal, wherein the first external terminal is configured to receive a test input signal from an external inspection device;

a core unit that includes a first internal circuit provided corresponding to the first external terminal and a second internal circuit provided corresponding to the second external terminal, and performs signal processing, using at least one of the first internal circuit and the second internal circuit, on the test input signal received by at least one of the first internal circuit and the second internal circuit via the first external terminal to generate a test output signal, the test output signal being output to the external inspection device via the first external terminal;

a switch circuit disposed on a wiring path between the terminal circuit and the core unit, wherein, when the external inspection device is connected to the first external terminal, the switch circuit selectively connects the first external terminal to the first internal circuit, the second internal circuit, or both the first internal circuit and the second internal circuit; and a switch control circuit that receives a test setting signal from the external inspection device and controls ON and OFF of one or more switches included in the switch circuit based on the test setting signal to select a connection destination of the external inspection device in the switch circuit, wherein the wafer test process includes outputting, by the probe inspection device, the test setting signal to the switch control circuit to output the test input signal to the first external terminal, or receiving the test output signal from the first external terminal.

11. The method according to claim 10, wherein the final test process includes outputting, by the semiconductor inspection device, the test setting signal to the switch control circuit, and outputting a test input signal to the first external terminal, or inputting a test output signal from the first external terminal.

12. The method according to claim 10, wherein the test setting signal is a serial signal, and wherein the switch control circuit selects a connection destination of the external inspection device based on a time-series pattern of the serial signal.

13. The method according to claim 10, wherein the test setting signal is a plurality of voltage signals, and wherein the switch control circuit selects a connection destination of the external inspection device based on a combination of a plurality of voltage values by the plurality of voltage signals.

14. The method according to claim 10, wherein the switch circuit includes:

a first switch that connects the first external terminal and the first internal circuit;

a second switch that connects the second external terminal and the second internal circuit; and a third switch that connects the first external terminal and the second external terminal.

15. The method according to claim 14, wherein the switch circuit fixes the first switch and the second switch to be on and fixing the third switch to be off before shipping the plurality of semiconductor devices after the final test process.

\* \* \* \* \*